US010416703B2

United States Patent
Sheafor et al.

(10) Patent No.: US 10,416,703 B2
(45) Date of Patent: Sep. 17, 2019

(54) COUNTER/TIMER ARRAY FOR GENERATION OF COMPLEX PATTERNS INDEPENDENT OF SOFTWARE CONTROL

(71) Applicant: Ambiq Micro, Inc., Austin, TX (US)

(72) Inventors: Stephen James Sheafor, Boulder, CO (US); Donovan Scott Popps, Austin, TX (US)

(73) Assignee: AMBIQ MICRO, INC., Austin, TX (US)

( * ) Notice: Subject to any disclaimer, the term of this patent is extended or adjusted under 35 U.S.C. 154(b) by 0 days.

(21) Appl. No.: 15/674,242

(22) Filed: Aug. 10, 2017

(65) Prior Publication Data
US 2019/0050019 A1    Feb. 14, 2019

(51) Int. Cl.
*G06F 1/08*        (2006.01)
*G06F 13/42*       (2006.01)
*G06F 1/12*        (2006.01)

(52) U.S. Cl.
CPC ............... *G06F 1/08* (2013.01); *G06F 1/12* (2013.01); *G06F 13/4291* (2013.01)

(58) Field of Classification Search
CPC .......... G06F 1/08; G06F 1/12; G06F 13/4291
USPC ........................................................ 713/502
See application file for complete search history.

(56) References Cited

U.S. PATENT DOCUMENTS

| | | | | |
|---|---|---|---|---|
| 3,789,195 A * | 1/1974 | Meier | .................... | H01H 43/00 377/20 |
| 3,878,370 A * | 4/1975 | Santomango | .......... | H01H 43/00 377/20 |
| 4,190,826 A * | 2/1980 | Alles | ........................ | G01D 5/24 178/17 C |
| 4,219,875 A * | 8/1980 | Templeton | .............. | G06F 13/22 711/148 |
| 4,546,487 A * | 10/1985 | Dackow | .................. | G04F 10/04 327/273 |
| 4,566,111 A * | 1/1986 | Tanagawa | ........... | G06F 11/0757 327/273 |
| 4,644,340 A * | 2/1987 | Holloway | ................ | G09G 5/18 345/26 |
| 4,805,199 A * | 2/1989 | Muramatsu | ............... | G06F 1/08 377/39 |
| 4,939,755 A * | 7/1990 | Akita | ........................ | G06F 1/14 377/39 |
| 4,990,796 A * | 2/1991 | Olson | ................. | G11C 11/5621 326/59 |
| 5,028,821 A * | 7/1991 | Kaplinsky | .......... | H03K 19/1736 326/38 |

(Continued)

*Primary Examiner* — Paul R. Myers
(74) *Attorney, Agent, or Firm* — David R. Stevens; Stevens Law Group

(57) ABSTRACT

A system includes an array of counter/timer units that execute a number of timing and pattern generation functions that are selectable by a processor to which the array is coupled. Counter/timer units may receive as inputs the outputs of other counter/timer units, such as for use as a trigger or clock input as instructed by the processor. Counter/timer units may be instructed to execute functions and be coupled to one another by a processor. The processor may then enable the counter/timer units such they subsequently produce complex outputs without additional inputs from the processor. The outputs of the counter/timer units may be used as interrupts to the processor or be used to drive a peripheral device.

18 Claims, 12 Drawing Sheets

(56) References Cited

U.S. PATENT DOCUMENTS

| | | | | |
|---|---|---|---|---|
| 5,056,001 A * | 10/1991 | Sexton | G05B 19/054 | 710/10 |
| 5,298,871 A * | 3/1994 | Shimohara | G06F 1/025 | 318/599 |
| 5,379,326 A * | 1/1995 | Nakahara | H04W 56/001 | 375/354 |
| 5,398,007 A * | 3/1995 | Yamazaki | G06F 1/08 | 327/114 |
| 5,430,781 A * | 7/1995 | Miyake | G06F 1/025 | 377/39 |
| 5,557,548 A * | 9/1996 | Gover | G06F 11/348 | 702/176 |
| 5,631,853 A * | 5/1997 | Miller | G06F 1/14 | 341/141 |
| 5,812,831 A * | 9/1998 | Crocker | G06F 7/62 | 327/175 |
| 5,854,755 A * | 12/1998 | Park | G06F 7/68 | 708/103 |
| 6,023,740 A * | 2/2000 | Korhonen | G06F 13/26 | 710/124 |
| 6,031,887 A * | 2/2000 | Kolagotla | H03K 23/50 | 377/116 |
| 6,085,343 A * | 7/2000 | Krishnamoorthy | G01R 31/318527 | 326/16 |
| 6,202,148 B1 * | 3/2001 | McCanny | G06F 7/762 | 712/229 |
| 6,313,679 B1 * | 11/2001 | Van Asma | H03K 5/135 | 327/158 |
| 6,456,781 B1 * | 9/2002 | Rijckaert | G11B 5/00813 | 386/317 |
| 7,961,837 B2 * | 6/2011 | Park | H03K 23/548 | 377/118 |
| 8,653,871 B1 * | 2/2014 | Courtel | H03K 3/017 | 327/175 |
| 8,861,304 B1 * | 10/2014 | Cope | G11C 7/1075 | 365/189.09 |
| 2002/0067220 A1 * | 6/2002 | Horng | C07C 67/28 | 333/17.1 |

* cited by examiner

COUNTER/TIMER ARRAY FOR GENERATION OF COMPLEX PATTERNS INDEPENDENT OF SOFTWARE CONTROL

BACKGROUND

Field of the Invention

This invention relates to systems for generating control signals for peripheral devices.

Background of the Invention

Many applications for low power microprocessors and microcontrollers include a requirement to generate specific patterns on one or more of the interface pins in order to control external peripheral devices. These devices may include stepper motors, vibrators, light generators such as LEDs, etc. Optimizing power is typically achieved by minimizing the amount of control the pin interface requires from the processor, since the processor and its associated memory systems are significant users of power.

Prior art implementations of such functions typically fall into two classes. In the first class, the processor directly controls the signal on each of the necessary device pins, which allows total software control but requires the processor to be active for each transition of each signal. In the second class, custom hardware implements the specific signal sequence required, which requires very little processor activity but is inflexible, since every possibly application must be defined in advance of the hardware design and the signals cannot then be optimized.

The system described herein provides an improved approach for generating complex signal patterns for driving a peripheral device without requiring processor control or application-specific circuits.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1A:
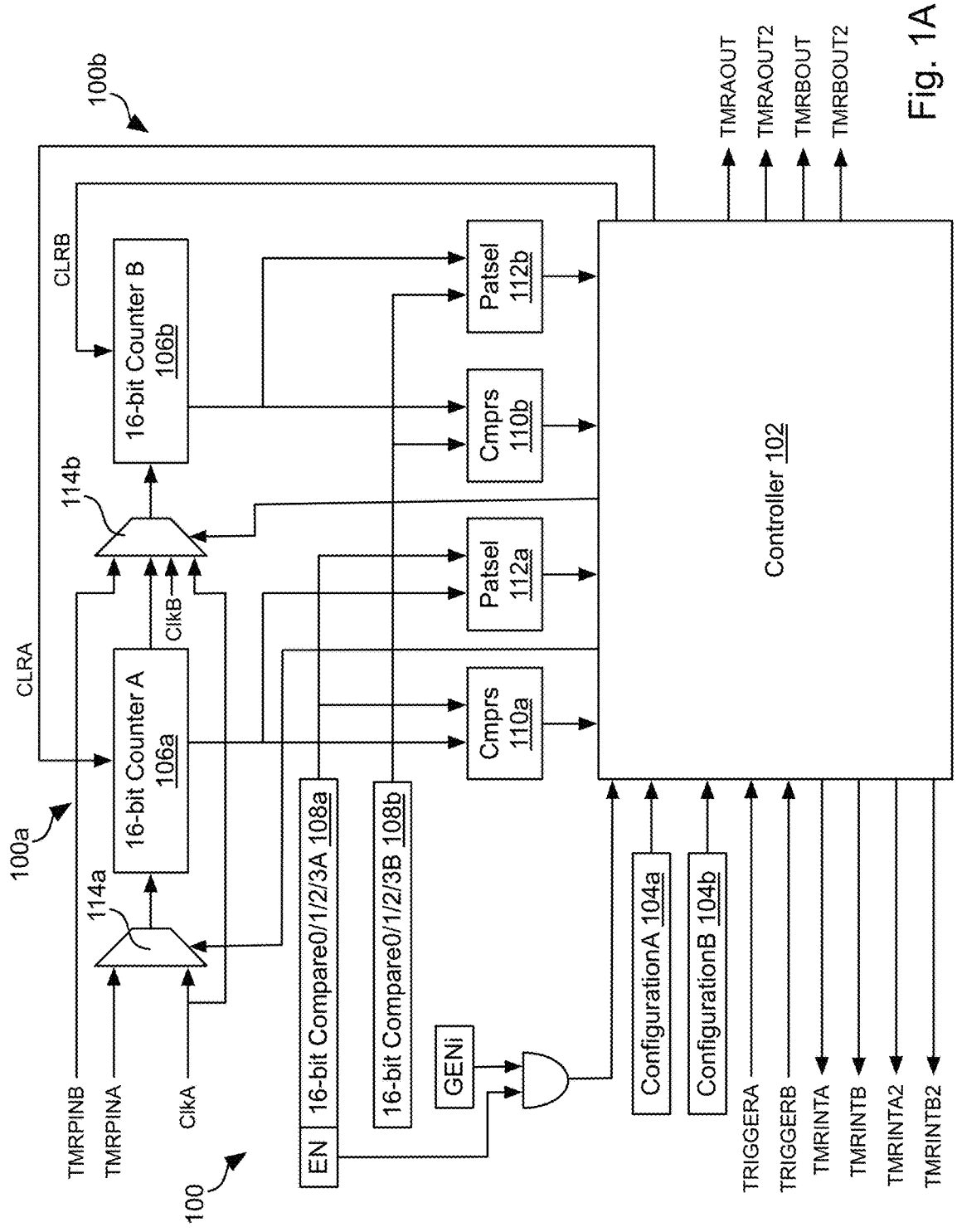
FIG. 1A is a schematic block diagram of a counter/timer module for use in accordance with an embodiment of the present invention.

Referring to FIG. 1A, the systems disclosed herein may be built of an array of counter/timer modules 100 (also referred to as a "CTimer"). Each counter/timer module 100 may have some or all of the attributes of the counters described in U.S. application Ser. No. 14/918,406 filed Oct. 20, 2015, and entitled LOW POWER ASYNCHRONOUS COUNTERS IN A SYNCHRONOUS SYSTEM, which is hereby incorporated herein by reference in its entirety.

Each counter/timer module 100 may include a controller 102 implementing the various functions of the counter/timer module 100 described below in cooperation with the other structures illustrated. The controller 102 may be an electronic circuit implementing the basic functions of the counter/timer module in cooperation with the other structures, as described below with respect to FIGS. 5A to 5L, below.

In the illustrated embodiment, each counter/timer module 100 actually implements two counter/timer units 100a, 100b that may function either independently or be linked to one another as described below. In the description below, the function of the counter/timer units 100a, 100b are described referencing the counter/timer unit 100a. The counter/timer unit 100b is identically configured and functions in the same way unless expressly indicated otherwise below.

The function implemented by the controller 102 may be controlled by bits in one or more configuration registers 104a, 104b each storing configuration bits for one of the counter/timer units 100a, 100b, respectively. In the illustrated embodiment, each counter/timer module 100 includes two counters 106a, 106b each corresponding to one of the counter/timer units 100a, 100b. The counters 106a, 106b may operate independently or in cooperation as described below. The counters 106a, 106b are preferably low power counters, such as those described in U.S. application Ser. No. 14/918,406. In the illustrated embodiment, each counter 106a, 106b is a 16-bit counter that may be combined to achieve a 32 bit counter. However, larger or smaller counters 106a, 106b may be used.

The counter/timer module 100 may further include two compare registers 108a, 108b each corresponding to one of the counter/timer units 100a, 100b. The compare registers 108a, 108b store a value input to the counter/timer module 100 for comparison with the contents of the corresponding counters 106a, 106b or performing other functions, such as pattern generation, as described in detail below.

The controller may receive outputs of comparison logic modules 110a, 110b that indicates whether the contents of the counters 106a, 106b are equal to the contents of the compare registers 108a, 108b, respectively. The comparison logic module 110a, 110b may output a first binary value, e.g. "1" if counter 106a, 106b is equal to the contents of compare register 108a, 108b, respectively, and otherwise output a second binary value, e.g. "0."

In some embodiments, there are multiple compare registers 108a, 108b for each counter/timer unit 100a, 100b. For example, in the illustrated embodiment there are four 16-bit compare registers 108a, 108b for each counter/timer unit 100a, 100b. In other example embodiments, there may be two, eight, or any number of compare registers 108a, 1080b for each counter/timer unit 100a, 100b. Accordingly, the comparison logic modules 110a, 110b may output a result of a comparison of some or all of these registers 108a, 108b to the contents of the counter 106a, 106b, respectively.

In the description below the registers 108a are referred to as CMPRA0, CMPRA1, CMPRA2, and CMPRA3 and the registers 108b are referred to as CMPRB0, CMPRB1, CMPRB2, and CMPRB3. In the Figures, reference to CMPR0, CMPR1, CMPR2, and CMPR3 may be understood to refer to either of the registers 108a or 108b inasmuch as the counter/timer units 100a, 100b operate in an identical fashion in all but the specific instances expressly indicated below.

The controller 102 may further receive outputs from pattern select modules 112a, 112b that output a bit from the compare registers 108a, 108b, respectively, in accordance with a state of the counters 106a, 106b, respectively. For example, each time the counter 106a is incremented, the pattern select module 112a may output a next bit in the compare register 108a, e.g., if counter 106a is equal to N, output the Nth bit of the compare register 108a, 108b. The pattern select module 112b may operate in an identical manner with respect to counter 106b and compare register 108b.

The counters 106a, 106b are incremented according to a clock input. Various options may be available as the clock input to the counters 106a, 106b. Accordingly, these sources may be coupled to the counters 106a, 106b by multiplexers 114a, 114b. A select input of each multiplexer 114a, 114b that selects which of the sources is asserted by the controller 102 to clock the counters 106a, 106b according to the function specified in the configuration registers 104a, 104b, respectively.

As shown in FIG. 1A, the sources input to multiplexer 114a include two pins TMRPINA as well as a ClkA signal. The sources input to multiplexer 114b include TMRPINB, the ClkA signal, a ClkB signal, as well as an output of counter 106a. This enables counter 106a to act as the clock for counter 106b. For example, an overflow or carry bit from counter 106a may be coupled to counter 106b such that counter 106a and counter 106b operate as a single counter having twice the size. In other embodiments, linking of counter/timer units 100a, 100b is achieved by using the output of counter 106a (e.g., a carry or overflow bit) to enable a change in counter 106b and using the same clock for both counter 106a, and counter 106b. This results in incrementing of counter 106b only when the carry or overflow bit is asserted by counter 106a.

Note that the ClkA and ClkB signals could include an oscillator, an analog clock source, a clock internal or external to the counter/timer module 100, or other source. Accordingly, additional selection logic (not shown) may be used by the controller 102 to select which of these sources is used as the ClkA and ClkB signals.

FIG. 1A illustrates various other inputs and outputs of the controller 102. As described below, these inputs and outputs may be coupled to the outputs and inputs of another counter/timer module 100. These include TRIGGERA and TRIGGERB inputs. These inputs may be used, subject to specification in the configuration registers 104a, 104b, to control the operation of the controller 102 with respect to the counter/timer units 100a, 100b, respectively, such as to start or stop the counters 106a, 106b.

TMRINTA, TMRINTB, TMRINTA2, and TMRINTB2 are outputs that are used as interrupts to a processing device to which the counter/timer module 102 is coupled and are set by the controller 102 according to the function specified in the configuration registers 104a, 104b.

TMRAOUT, TMRAOUT2, TMRBOUT, TMRBOUT2 are outputs generated by the controller 102 according to the function specified in the configuration registers 104a, 104b for a particular counter/timer unit 100a, 100b and may be coupled to another counter/timer unit 100a, 100b of the same or a different counter/timer module 100 or to an input of a peripheral device. Note also that the controller 102 may clear the values of the counters 106a, 106b using control lines CLRA and CLRB, respectively.

As is apparent in FIG. 1A, the counter/timer module 100 is actually two counter/timer units 100a, 100b operating around the counters 106a and counter 106b, each with its own configuration register 108a, 108b, comparison logic module 110a, 110b, pattern select module 112a, 112b, and set of inputs and outputs (designated by "A" and "B" and "a" and "b" characters in the labels of FIG. 1A). The controller 102 may implement the functions for each counter/timer unit 100a, 100b separately accordingly to the separate configuration registers 104a, 104b or may combine them to achieve a counter/timer unit with double the counter size and double the compare register size.

The controller 102 may use or store additional synchronization values. In some embodiments, an array of counter/timer modules 100 may be synchronized using a global enable signal or enabled individually. Accordingly a GENi bit may correspond to a particular counter/timer unit i, in a global register. Bit EN, which may be included in each compare register 108a, 108b, may be an individual enable bit that may be set for an individual counter/timer unit 100a, 100b. These bits may be ANDed together such that assertion of either bit will enable the corresponding counter/timer unit 100a, 100b to commence or continue execution of a function specified in the configuration registers 104a, 104b. A counter/timer unit 100a, 100b may be suppressed or enabled according to the EN bit or a GENi bit by suppressing or enabling a clock input to the corresponding counter 106a, 106b.

In some embodiments, the controller 102 may trigger interrupts, such as on outputs TMRINTA-TMRINTB2. In some embodiments, this results in setting of a bit WCi corresponding to a particular counter/timer unit i. This bit WCi may be read and cleared by a processing device. There may be multiple bits for each counter/timer unit 100a, 100b, such as for each interrupt TMRINTA and TMRINTA2 for counter/timer unit 100a and each interrupt TMRINTB and TMRINTB2 for counter/timer unit 100b.

Figure 1B:
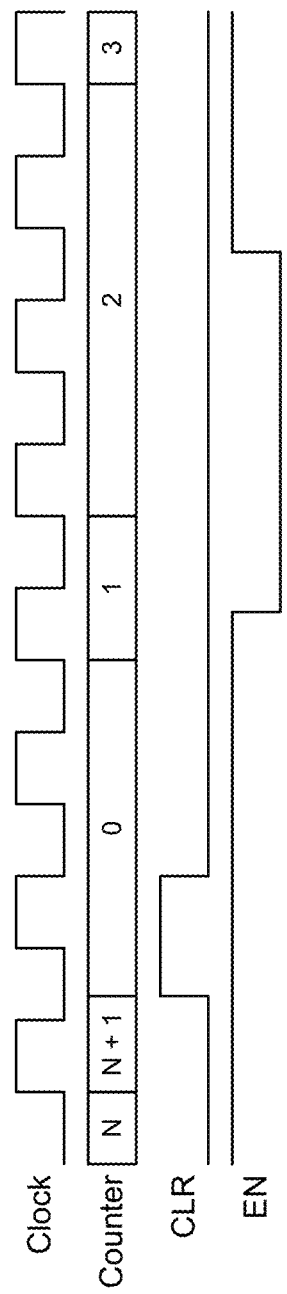
FIG. 1B is a timing diagram illustrating clocking, clearing, and enabling of a counter/timer unit in a counter/timer module in accordance with an embodiment of the present invention.

Referring to FIG. 1B, the overall operation of each counter/timer unit 100a, 100b may be controlled by two configuration bits in the configuration registers 108a, 108b, CLR and the EN bit mentioned previously. When CLR is set to 1, the counter/timer unit 100a, 100b is immediately set to all zeroes and will remain there independent of any other configuration. CLR is typically used to initialize a counter/timer unit 100a, 100b before use.

EN is used to enable (when 1) and disable (when 0) the counting function of a counter/timer unit 100a, 100b. However, EN and the deassertion of CLR may be synchronized to the selected clock (e.g., the clock selected by multiplexer 114a, 114b), which must be accounted for when they are used.

FIG. 1B shows how this synchronization occurs. When CLR is set to 0, the counter 106a, 106b of the counter/timer unit 100a, 100b will begin counting on the second edge of the selected clock if EN is set to 1. When EN is set to 0, the counter 106a, 106b will increment on the next clock (from 1 to 2 in FIG. 1B) and then hold its current value. When EN is set to 1, the counter 106a, 106b will resume counting on the second following edge.

Since the operation of the processor may be essentially asynchronous to the selected clock, the synchronization introduces an uncertainty as to when the counter 106a, 106b will begin counting. If the frequency of the selected clock is high relative to the processor clock, the impact of the synchronization will be negligible. However, for low frequency clocks, external pin clocks and buck clocks the effective delay caused by the synchronization may be significant.

Under normal conditions, the external clock inputs to the counter/timer unit 100a, 100b may be supplied by a clock selected in a REG_CTIMER_CTCTRLx_TMRxyCLK register field of the configuration registers 104a, 104b. However, if software reads a TMR value (e.g., TMRAOUT-TMRBOUT2), the clock may be temporarily synchronized to the processor clock, which may cause the time of edges on an output to move slightly. The time of any edge will be moved by at most 20 ns from the normal time for a 48 MHz clock, i.e., one period of the synchronizing clock. If this variation is unacceptable for a specific application, it can be eliminated in one of two ways:

1) Do not read the TMR value when it could possibly be changing, e.g., during the output generation. Output generation occurs when EN is 1. This is often an acceptable restriction.
2) Set a REG_CTIMER_CTAUXxy_NOSYNC register bit in the configuration register 108a, 108b. This will disable this synchronization function.

If the NOSYNC bit is set, the TMR update will no longer be synchronized to the processor clock. As a result, the TMR value read might be incorrect. In this case, software may be programmed to read the TMR three times in quick succession (with interrupts disabled) and determine the correct value from those. If the first two reads are the same, that is the correct value. If they are different, the third value is correct.

Note that the synchronizing functions described above with respect to FIG. 1B may include implementing some or all of the functionality of U.S. application Ser. No. 14/918,406.

Figure 2:
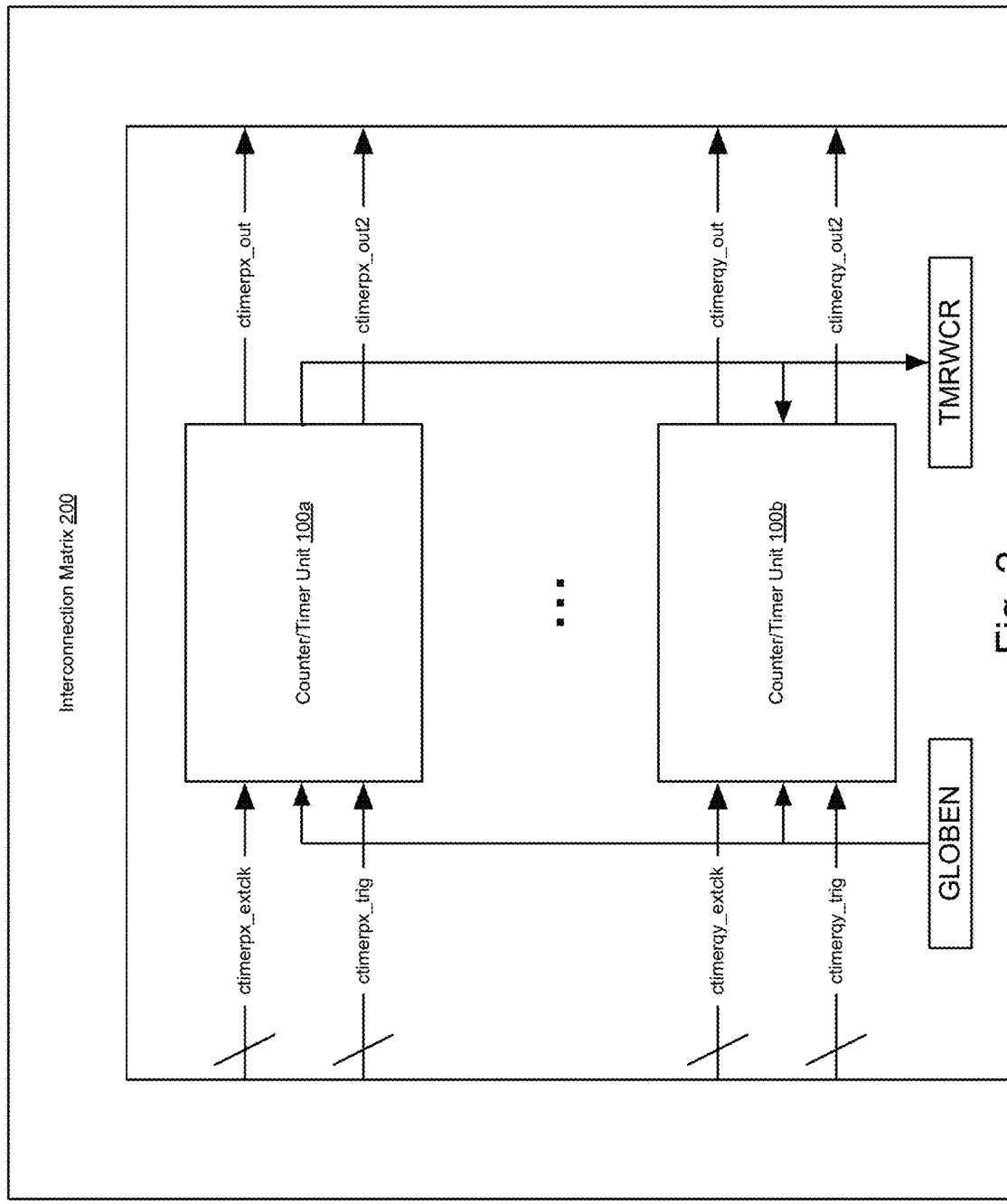
FIG. 2 is a schematic block diagram of an array of counter/timer modules and an interconnection matrix in accordance with an embodiment of the present invention.

Referring to FIG. 2, an array of counter/timer modules 100 may be connected to one another by an interconnection matrix 200. The interconnection matrix 200 may couple each output of each counter/timer unit 100a, 100b of each counter/timer module 100 to each input of each counter/timer unit 100a, 100b. The value stored in the configuration registers 104a, 104b of each counter/timer unit 100a, 100b may specify which output is selected for coupling to a particular input of the each counter/timer unit 100a, 100b.

In some embodiments, the interconnection matrix 200 includes no logic but rather is simply a bus including lines for all of the inputs and outputs of all of the counter/timer units 100a, 100b of all of the counter/timer modules 100. The controllers 102 of each individual counter/timer module 100 then controls which outputs to connect to the inputs of its counter/timer units 100a, 100b.

As shown in the illustrated embodiment, an eleven-line bus "ctimerpx_extclk" may couple a plurality of external clock sources to each counter/timer unit 100a, 100b for selection as the ClkA, ClkB signal. A fifteen-line bus "ctimerpx_trig" couples the outputs (TMRAOUT, TMRAOUT2, TMRAOUT, TMRAOUT2) of the other counter/timer units 100a, 100b to the trigger inputs (TRIGGERA and TRIGGERB) of another counter/timer unit 100a, 100b. Note that, in some embodiments, ctimerpx_extclk and ctimerpx_trig are only fifteen and eleven lines wide, respectively and therefore, in the illustrated embodiment, each counter/timer unit may only be able to select from fifteen triggers and eleven external clocks.

Ctimerpx_out may be a bus that coupled the outputs TMRAOUT and TMRBOUT to the interconnection matrix 200 and ctimerpx_out2 may be a bus that couples the outputs TMRAOUT2 and TMRBOUT2 to the interconnection matrix 200. Corresponding buses ctimerqy_out, ctimerqy_out2 may couple the outputs of each of the other counter/timer modules 100 to the interconnection matrix 200.

The array of counter/timer modules 100 may include one or more global registers controlling operation of the array, such as a GLOBEN register that has individual bits enabling each counter/timer unit 100a, 100b when set. In this manner, multiple counter/timer modules 100 may be enabled simultaneously by setting their corresponding bits in the GLOBEN register.

A TMRWCR register may store the interrupt bit for each counter/timer unit 100a, 100b. For example, bits WCi may be bits in the TMRWCR register, each corresponding to a particular counter/timer unit i and that may be set in response to asserting one of the TMRINTA through TMRINTB2 lines of the counter/timer unit i.

Figure 3:
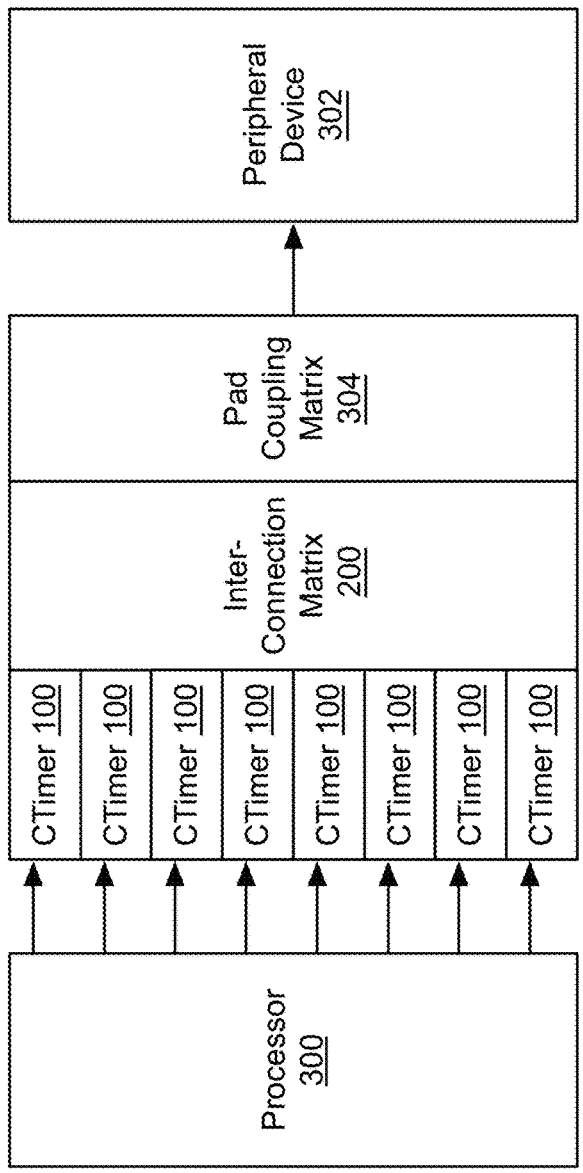
FIG. 3 is a schematic block diagram of a system incorporating the array of counter/timer modules.

Referring to FIG. 3, in an example, implementation, a processor 300 executing software specifies the values in the configuration registers 104a, 104b, compare registers 108a, 108b, sets the individual enable bits EN or GLOBEN bits in order to start execution of the array of counter/timer modules 100 according to the registers 104a, 104b, 108a, 108b. The processor 300 may be any processing device and may include one or more processing devices. The processor 300 may be part of a general purpose computing device such as desktop, laptop, or server computer, a mobile device such as a mobile phone, tablet computer, or wearable computer, or an embedded processor in a smart device such as a fridge, washing machine, lighting system, or the like.

In the illustrated embodiment, there are eight counter/timer modules 100, numbered 0 through 7. The outputs of one or more of the counter/timer units 100a, 100b of the counter timer/modules 100 may be coupled to the inputs of one or more other counter/timer units 100a, 100b to implement complex functions. In this manner, once the counter/timer array is configured and enabled, no software or processor control is required in order to output a sequence of pulses of arbitrary timing, width, repetition, etc. Example uses cases for the array of counter/timer modules 100 are described below with respect to FIGS. 6A to 6F.

Some of the outputs of some of the counter/timer modules 100 may be coupled to inputs of a peripheral device 302. For example, a pad coupling matrix 304 may be configurable by the processor 300 to couple a particular output of a particular counter/timer unit 100a, 100b to a particular input pad of the peripheral device 302.

Example peripheral device 302 may include one or more light sources (e.g. LED (light emitting diode)), vibrators, stepper motors, or any other type or number of analog or digital devices.

Figure 4:
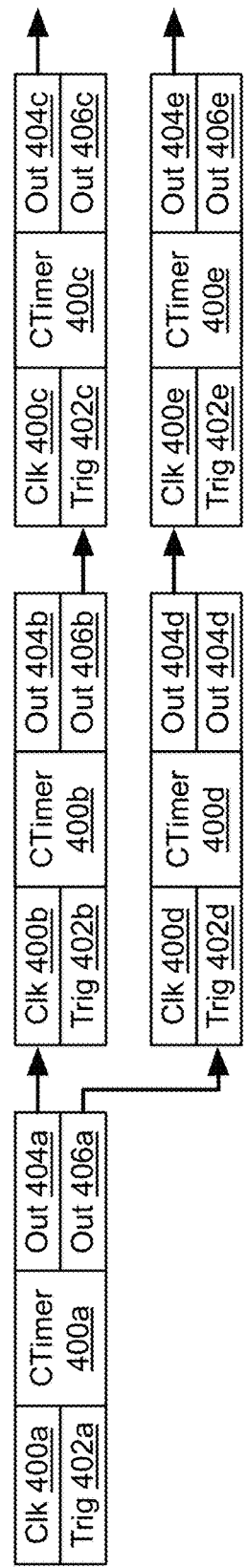
FIG. 4 is schematic diagram illustrating a possible interconnection between units of counter/timer modules in accordance with an embodiment of the present invention.

FIG. 4 illustrates logically how inputs of one counter/timer unit 100a, 100b may be connected to the outputs of another counter/timer unit 100a, 100b. The illustrated arrangement may be achieved by selecting interconnections between inputs and outputs by means of the interconnection matrix 200. In the illustrated example, there are five counter/timer units (CTimers) 400a-400e, each of which is a counter/timer unit 100a, 100b.

In the illustrated example, an output 404a (e.g. TMRAOUT, TMRAOUT2, TMRBOUT, and TMRBOUT2) of counter/timer module 400a is coupled to the clock input 400b (e.g. Clk input) of another timer 400b. An output 406b of counter/timer module 400b is coupled to a trigger input 402c (e.g., TRIGGERA, TRIGGERB) of another counter/timer module 400c. An output 404a the counter/timer module 400c may be coupled to an input of another counter/timer unit 100a, 100b or an input of a peripheral device 302.

In the illustrated example, another output 406a of the counter/timer module 400a is coupled to a trigger input 402d of another counter/timer module 400d. An output 494d of counter/timer module 400d is coupled to a clock input of counter/timer module 400e. An output 404e of counter/timer module 100e may be coupled to an input of another counter/timer unit 100a, 100b or another input of the peripheral device 302.

As is apparent from FIG. 4 with eight counter/timer modules 100, each having two counter/timer units 100a, 100b, there may be up to sixteen nodes in the illustrated hierarchy thereby providing an enormous array of possible arrangements. This, in combination with the many possible inputs and outputs of each counter/timer unit 100a, 100b that may be coupled to another counter/timer unit 100a, 100b and the multiple functions that may be implemented by the controller 102 for each counter/timer unit 100a, 100b, results in the ability to configure highly complex patterns of pulses with arbitrary pulse widths and timings without the need for an application-specific circuit.

All of this complexity is achieved without any processor intervention after the configuration registers 104a, 104b, compare registers 108a, 108b are set and the counter/timer units 100a, 100b are enabled. This results in reduction in loading of a processor and corresponding power savings due to the simplicity of the counter/timer modules. If software control or feedback is desired, interrupts (TMRINTA, TMRINTB, TMRINTA2, TMRINTB2) may be configured.

The functions that may be implemented by a counter/timer unit 100a, 100b or combination of counter/timer units 100a, 100b may include:
1. Interrupt after a specified delay
2. Interrupt periodically with a specified period
3. Determine an elapsed time between events
4. Generate an external pulse of a specified width, configurable after a specified delay
5. Generate an external PWM (pulse width modulation) signal with a specified period and duty cycle
6. Count edges on an external input
7. Interrupt after a specified number of external pulses
8. Generate complex patterns on one or both outputs, useful for stepper motor control signals
9. Generate outputs triggered or terminated by outputs of other Timer/Counters
10. Generate a specified number of patterns
11. Special inversion functions to support bidirectional stepper motor patterns The functions implemented by each counter/timer module 100 and some example use cases for an array of counter/timer modules 100 connected by an interconnection matrix 200 are outlined below.

Counter/Timer Functions

The controller 102 of each counter/timer module 100 may be programmed to operate each counter/timer unit 100a, 100b in a mode controlled by values written to the corresponding configuration registers 104a, 104b. In one implementation, each configuration register 104a, 104b includes a REG_CTIMER_CTCTRLx_TMRxyFN ("FN") bit field (x=0 to 7, y=A or B) that specifies this function for the corresponding counter/timer unit 100a, 100b. The mode affects both the generation of interrupts and the control of the outputs. Each mode is described in the following sections. Note that for all functions except for Pattern Generation, a compare value of zero (a count of 1) in one of the compare registers 108a, 108b may be invalid.

In some embodiments, the first measured period will be between the CMPRA0 value ("cmpr value") plus two and cmpr value plus three. Subsequent repeated cycles will be correctly of length (cmpr value+1). In the illustrated embodiment there are eight modes FN=0 to 7:
1. 0=>Single Count: Counts one time to the compare value, then the output changes polarity and stays at that level, with an optional interrupt.
2. 1=>Repeated Count: Periodic 1-clock-cycle wide pulses with optional interrupts.
3. 2=>Single Pulse (One Shot): A single pulse of programmed width, with an optional interrupt.
4. 3=>Repeated Pulse: A rectangular (or square) waveform with programmed high and low widths, and optional interrupts on each cycle.
5. 4=>Single Pattern: one burst of bits specified by the CMPRA0/1/2/3 registers.
6. 5=>Repeated Pattern: repeated burst of bits specified by the CMPRA0/1/2/3 registers.
7. 6=>Continuous: Free running timer with a single level change on the output and a single optional interrupt.
8. 7=>Alternate Pulse: like Repeated Pulse but alternating between two different pulse width/spacing settings.

Single Count (FN=0)

Figure 5A:
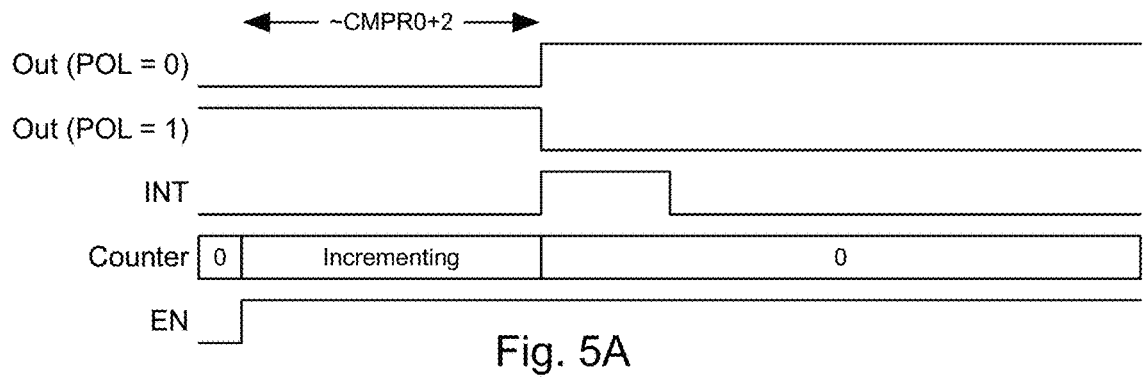
FIGS. 5A through 5L are timing diagrams illustrating functions of a counter/timer module in accordance with an embodiment of the present invention.

Operation in this mode is shown in FIG. 5A. Note that in the description of this and the other functions, only function with respect to one counter/timer unit 100a is described. The function for the other counter/timer unit 100b of a counter/timer module 100 is identical with respect to its corresponding configuration register 104a and counter 106a unless expressly indicated otherwise.

When the counter/timer unit 100a is enabled, a selected pin "OUT" (representing TMRAOUT or TMRAOUT2 selected according to the configuration register 104a in this and the following modes) is at the level selected by a POL bit in configuration register 104a. The counter 106a will be at zero because a bit REG_CTIMER_TMRxyCLR (CLR) in the configuration register 104a has previously been asserted. The counter 106a counts up on each rising edge of the clock input selected by the controller 102 by means of multiplexer 114a.

When counter 106a reaches a value in the CMPRA0 register, the OUT pin switches polarity (if a pin is selected according to the configuration register 104a) and an interrupt on INT (e.g., TMRINTA, TMRINTA2) is generated (if an REG_CTIMER_TMRxyIE ("IE") bit in the configuration register 104a is set). At this point the counter 106a is reset by the controller 102 to 0 and the value on OUT is maintained at the selected level until the counter 106a is cleared with CLR in the configuration register 104a. Where the configuration register 104a indicates that an interrupt is to be changed (e.g., the IE bit is set) based on the counter 106a, the interrupt may be subsequently cleared by writing the corresponding WC bit in the TMRWCR Register for the counter/timer unit 100a. This may be performed by the processor 300.

Repeated Count (FN=1)

Figure 5B:
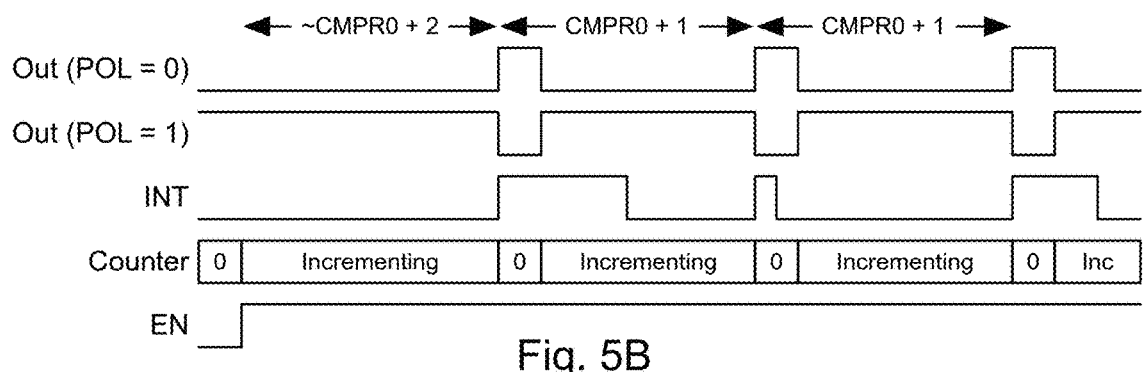

Operation in this mode is shown in FIG. 5B. When the counter/timer unit 100a is enabled, OUT is at the level selected by the POL bit and the counter 106a is at zero because CLR has been asserted previously. The counter 106a counts up on cycle of the selected clock, and when it reaches the value in the corresponding CMPRA0 Register, OUT switches polarity (if an output pin is selected) and an interrupt is generated (if the IE bit is set). At this point the counter 106a is reset to 0 and OUT is maintained at the selected level for one clock cycle, after which it returns to the original value. The counter 106a then continues to count up and the process is repeated, creating a stream of pulses or interrupts at a fixed interval. The interrupt may be subsequently cleared by writing the corresponding WC bit in the TMRWCR Register at any point prior to the next setting pulse.

If the EN (enable) bit (also referred to as REG_CTIMER_TMRxyEN) or the corresponding GLOBALEN bit for the counter 106a is cleared, the counter 106a will stop counting but will not be cleared, so the sequence may be paused and then resumed. Setting CLR will reset the counter 106a to zero. Note that CMPRA0 must be at least 1 in some embodiments so that the repeat interval is two clock cycles.

Single Pulse (FN=2)

Figure 5C:
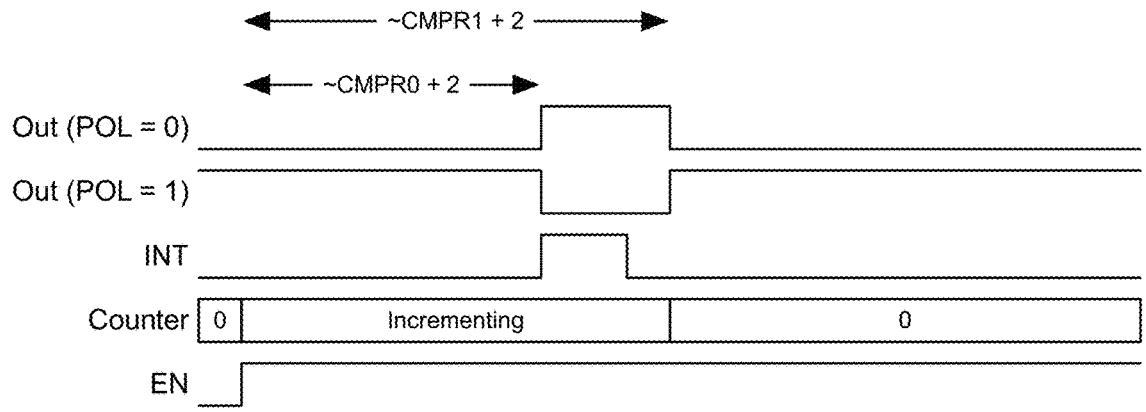

Operation in this mode is shown in FIG. 5C. When the counter/timer unit 100a is enabled, OUT is at the level selected by the POL bit and the counter 106a is at zero because CLR has been asserted previously. The counter 106a counts up on each cycle of the selected clock, and when it reaches the value in the corresponding CMPRA0 Register, OUT switches polarity (if an output pin is selected) and an interrupt is generated (if the IE bit is set). At this point the counter 106a continues to increment and OUT is maintained at the selected level until the counter 106a reaches the value in the CMPRA1 Register, at which point it switches back to the original level. This allows the creation of a pulse of a specified width. The counter 106a is then reset to 0 so that a single pulse is created. The interrupt may be subsequently cleared by writing the corresponding WC bit in the TMRWCR Register.

Repeated Pulse (FN=3)

When the counter/timer unit 100a is enabled, OUT is at the level selected by the POL bit and the counter 106a is at zero because CLR has been asserted previously. The counter 106a counts up on each cycle of the selected clock, and when it reaches the value in the corresponding CMPRA0 Register, OUT switches polarity (if an output pin is selected) and an interrupt is generated (if the IE bit is set). At this point the counter 106a continues to increment with each cycle of the selected clock and OUT is maintained at the selected level until the counter 106a reaches the value in the CMPRA1 Register, at which point OUT switches back to the original level. This allows the creation of a pulse of a specified width. The interrupt may be cleared by writing the corresponding WC bit in the TMRWCR Register. Note that CMPRA1 would be at least 1 so that the repeat interval is at least two clock cycles.

Upon reaching the value in CMPRA1, the counter 106a is reset to 0 and continues to increment with each cycle of the selected clock, so that a stream of pulses of the specified width and period is generated. If the EN bit is cleared, the counter 106a stops counting, but is not cleared, so the sequence may be paused and restarted. This mode is particularly valuable for creating a PWM (Pulse Width Modulation) output on OUT which may be used, for example, to vary the brightness of an LED.

Figure 5D:
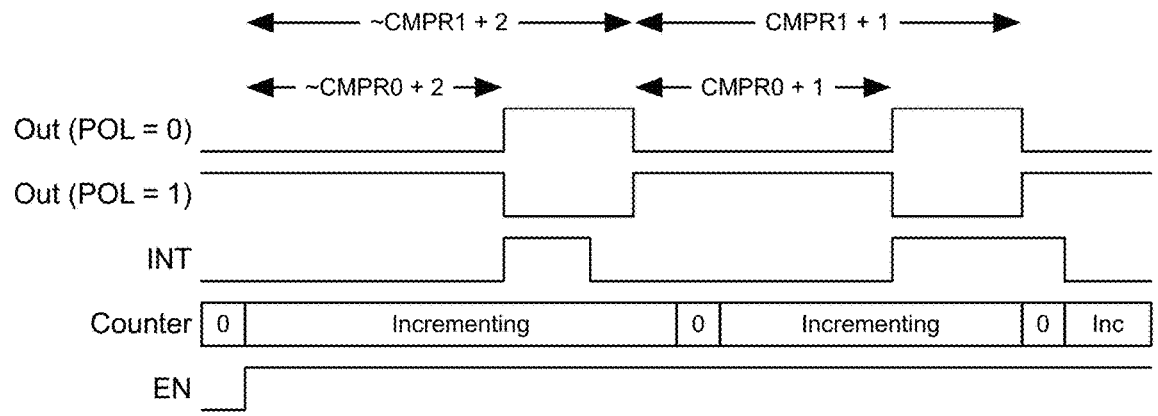

As shown in FIG. 5D, where an interrupt is enabled, this occurs on the rising edge of INT if a bit IE0 is set in the configuration register 104a, as shown in FIG. 5D. In some embodiments, a secondary interrupt is generated on the falling edge of OUT if a bit IE1 is set in the configuration register 104a.

Single Pattern (FN=4)

Figure 5E:
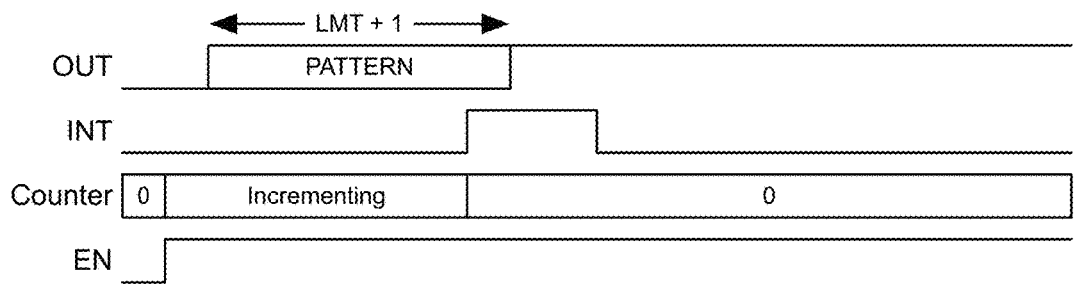

In this mode the counter/timer unit 100a outputs a pattern from values stored in the CMPRA0/1/2/3 registers rather than from comparisons to the counter 106a as shown in FIG. 5E. The counter 106a is still used to step through the pattern bits. Bit 0 of CMPRA0 is output on OUT when the Counter is 0, bit 1 is output when the counter 106a is 1, and so on until the counter 106a reaches 16. At that point bit 0 from CMPRA1 is output. Similarly, when the counter 106a reaches 32, the bits from CMPRA2 will be output, and when the counter 106a reaches 48, the bits from CMPRA3 will be output. When the counter 106a reaches the limit set by a value REG_CTIMER_CTAUXxy_LMT (also referred to herein as LMT) in the configuration register 104a, the pattern generation stops and OUT returns to 0 as shown in FIG. 5E. Since bit output starts when the counter 106a is at 0 and the counter 106a is compared to LMT, LMT+1 bits will be output. This is only an example configuration. The number of bits in the CMPRA0/1/2/3 registers may be smaller or greater than 16 in some implementations.

The pattern generation will begin between 1 and 2 clock cycles after EN is asserted due to asynchronicity between the controller 102 and the processor 300, which may have different clocks. The polarity of OUT is controlled by the POL bit as in other cases. If LMT is greater than one less than the total number of bits in the registers CMPRA0/1/2/3, 63 in the illustrated example, the pattern may be repeated until LMT+1 is reached.

A normal interrupt is generated when the pattern completes if IE0 is set. If LMT is greater than 31 (one less than the total number of bits in CMPRA0 and CMPRA1), the secondary interrupt will be generated when the counter 106a reaches 31 if IE1 is set.

If LMT is greater than a value T that is one less than the total number of bits in the compare registers 108a, T=63 in this case, the pattern generation will use a combined register mode (i.e., the total number of bits in the compare registers 108a, 108b, which is 2T=128 bits in this example). This mode is available in some embodiments only for the counter 106a of the pair of counters in a counter/timer module 100, not the counter 106b. In this mode, the first half of the pattern, T=64 bits in the illustrated embodiment, is taken from the CMPRA0/1/2/3 registers 108a as described above, and the remaining bits (up to a total of 2T=128 in the illustrated example) are taken from the CMPRB0/1/2/3 registers 108b. In this case, if IE1 is set, the secondary interrupt will be generated when the counter 106a reaches T.

Repeat Pattern (FN=5)

Figure 5F:
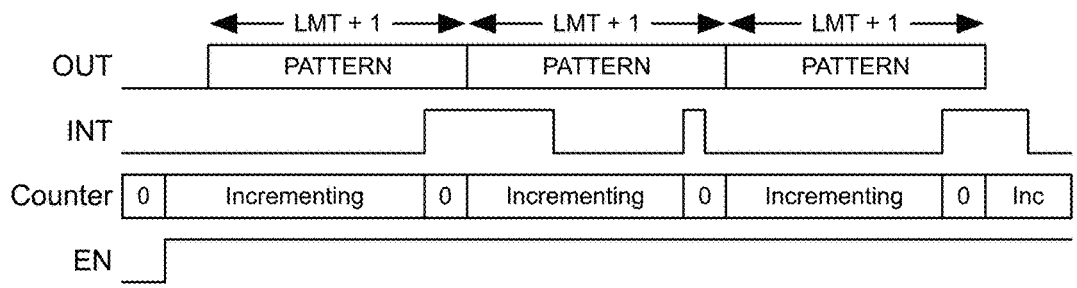

In this mode the counter/timer unit 100a outputs the pattern from CMPRA0/1/2/3 just as in the Single Pattern case, but the pattern repeats as soon as the LMT value is reached, as shown in FIG. 5F. The polarity is controlled by POL, and, if LMT is greater than 63 (one less the total number of bits in the registers CMPRA0/1/2/3), the pattern will repeat within each pattern burst, although it will restart at the beginning once LMT is reached. The pattern generation will begin 1 or 2 clock cycles after EN is asserted.

The normal interrupt is generated when the pattern completes if IE0 is set. If LMT is greater than one less than the total number of bits in CMPRA0 and CMPRA1, 31 in this example, the secondary interrupt will be generated when the counter 106a reaches LMT, if IE1 is set. This allows software to set up a pattern having a number of bits equal to the total number of bits CMPRA0/1/2/3 (64 in this case) and reload each half of the pattern once it is transferred out.

If LMT is greater than a value T equal to one less than the total number of bits in CMPRA0/1/2/3, T=63 in this case, the pattern generation will use combined register mode. This mode is only available for the counter 106a of the pair of counters of a counter/timer module 100. In this mode, the first half of the pattern (T=64 bits in this example) is taken from the CMPRA0/1/2/3 registers 108a as described above, and the remaining bits (up to a total of 2T=128 in the illustrated example) are taken from the CMPRB0/1/2/3 registers 108b. If IE1 is set, the secondary interrupt will be generated when counter 106a reaches T.

Continuous (FN=6)

Figure 5G:
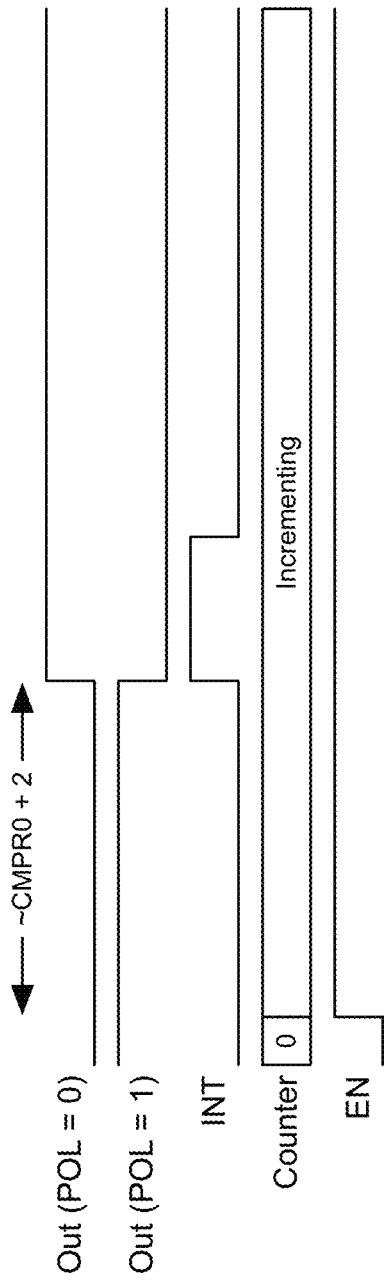

Operation in this mode is shown in FIG. 5G. When the counter/timer unit 100a is enabled, OUT is at the level selected by the POL bit and the counter 106a is at zero because CLRA has been asserted previously. The counter 106a counts up on each cycle of the selected clock, and, when it reaches the value in the corresponding CMPRA0 Register, OUT switches polarity (if an output pin is selected) and an interrupt is generated (if the IE bit is set). The counter 106a continues to count and is never automatically reset. If the counter 106a rolls over to zero and reaches the CMPRA0 value again, an interrupt will not be generated and OUT will not change.

This mode is primarily used for two functions. The first is counting transitions on an external input pin (e.g., that is used as the selected clock), and it may be valuable to generate an interrupt when a specified number of transitions have been detected. The second is as a general timer which software reads in order to measure time periods. In this second case an interrupt is often not used and the IE bit will not be enabled in most cases.

Alternate Pulse (FN=7)

Figure 5H:
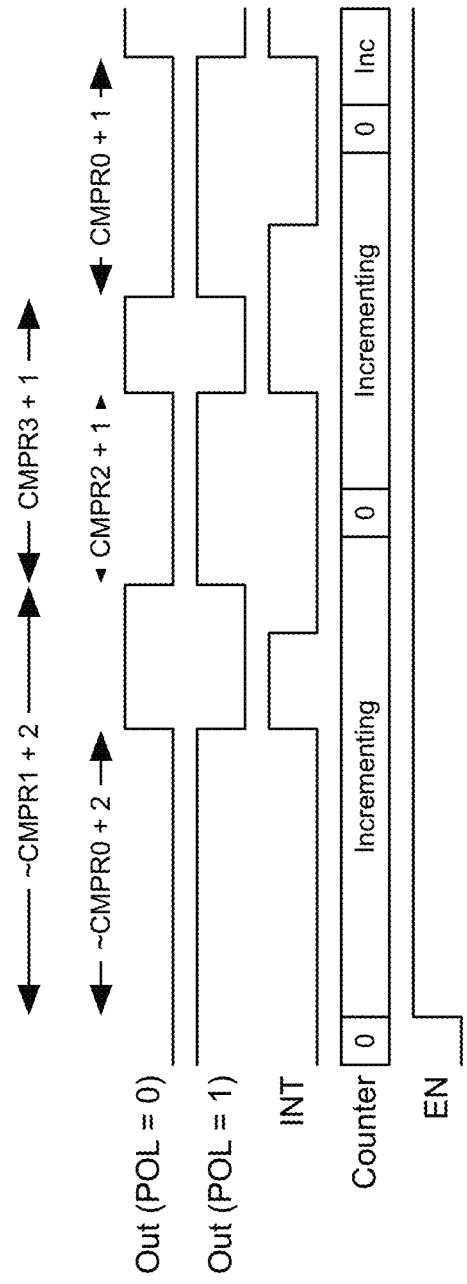

Operation in this mode is shown in FIG. 5H, and is very similar to Repeated Pulse mode (FN=3). The only difference is that at the end of each cycle, the comparison register switches between CMPRA0/1 and CMPRA2/3. This can be used to create a more complex stream of pulses, and may also be used to support an efficient software controlled audio output.

Linking Counter/Timer Units

Combining Counters

Each pair of counters 106a, 106b of the counter/timer units 100a, 100b in the same counter/timer module 100 may be combined to create a counter having twice the size (two 16 bit counters 106a, 106b function as a single 32 bit counter in this example) in all modes except for the pattern modes (FN=4 and 5). This configuration is created by setting a bit REG_CTIMER_CTCTRLx_CTRLINKx in the configuration register 108a. The remaining control bits counter/timer unit 100a are used to control the 32-bit counter, and the control bits in register 108b are ignored. The CMPRA0, CMPRA1, CMPRA2 and CMPRA3 registers 108a, are each concatenated with the corresponding CMPRB0, CMPRB1, CMPRB2, CMPRB3 registers 108b to provide comparison values having twice the width of an individual register (from 16 to 32 bits in the illustrated example), and all timer modes described herein are supported in the same manner as described herein. Note that, when combined in this way, the clock input for counter 106b is the overflow or carry output of counter 106a.

A pair of combined counter/timer units 100a, 100b may operate in the same manner and perform any functions ascribed herein to an individual counter/timer unit 100a, 100b.

Creating a Secondary Output with CMPRA2/3

Figure 5I:
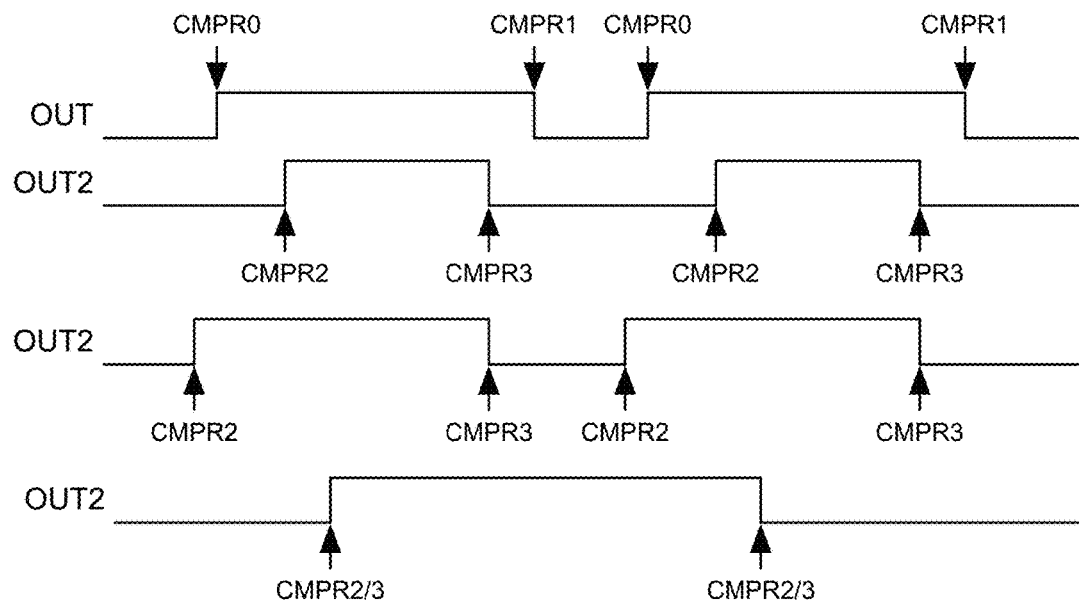

In any of the count or pulse modes (FN=0, 1, 2 or 3), the CMPRA2, and CMPRA3 registers provide two additional comparison points. When the counter 106a reaches a value in either CMPRA2 or CMPRA3, the secondary output OUT2 is toggled. This allows the creation of complex combinations of the two outputs, as shown in FIG. 5I. In these examples, the counter/timer unit 100a is configured in repeated pulse mode (FN=3) for counter 106a to produce OUT, and several variations for OUT2 are shown. In the first example, values of CMPRA2 and CMPRA3 are selected such that OUT2 produces a pulse of shorter duration than that on OUT and which both starts after end ends before the pulse on OUT2. In the second example, CMPRA2 and CMPRA3 are selected such that the pulse on OUT2 is initiated before the pulse on OUT and has a different (shorter) duration. The third example is particularly interesting. If CMPRA2 and CMPRA3 are set to the same value, or one of them is set to a value larger than CMPRA1, OUT2 will toggle only once per OUT cycle, creating a divide-by-two signal.

CMPRA2 and CMPRA3 operate in the same way for pulse and count modes. Thus in Single Count mode (FN=0) for example, OUT2 can produce a single pulse or transition at any time prior to the termination of the count when OUT goes high. The polarity of OUT2 is controlled by a REG_CTIMER_CTAUXxy_POL23 bit in the configuration register 104a.

Generating Dual Patterns

Figure 5J:
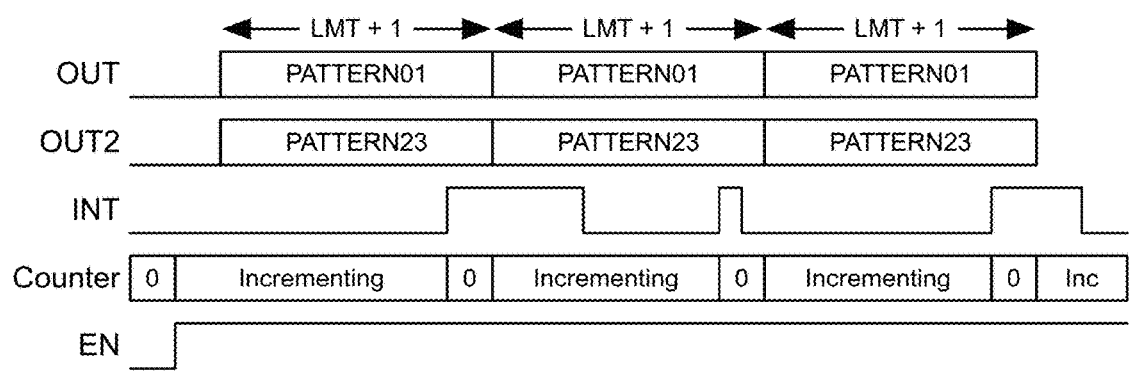

If a REG_CTIMER_CTAUXxy_EN23 bit is set in a Pattern Mode in the configuration register 104a, a dual pattern will be created on OUT and OUT2. The pattern on OUT will use only the CMPRA0/1 register bits, and the pattern on OUT2 will use the CMPRA2/3 register bits, so that the longest dual pattern that can be created is the size of two registers (32 bits in the illustrated embodiment). The output patterns are shown in FIG. 5J where Pattern01 includes the bits from CMPRA0/1 and Pattern23 includes the bits from CMPRA2/3. Dual patterns are particularly valuable in the case of stepper motor control signals, which require positive and negative signals to be generated synchronously.

Synchronized A/B Patterns

If a CTLINK bit is set in the configuration register 104b and a Pattern mode is selected (FN=4 or 5), the pattern comparison value is taken from counter 106a rather than from counter 106b. This allows the generation of two patterns using the OUT outputs of both counters 106a, 106b, the patterns each having a length up to the total number of bits in the set of four compare registers CMPRA0/1/2/3, 64 bits in this case. The counters may be enabled and cleared with an enable bit EN23 in both cases. In some cases, four patterns using the OUT and OUT2 outputs of both counters 106a, 106b may be generated as described above using the CTLINK bit, each pattern having a length up to the length of two of the CMPRA0/1/2/3 registers, 32 bits in this case. This function may likewise be enabled and cleared with EN23 set for both cases.

Triggering Functions

A REG_CTIMER_CTAUXxy_TRIG ("TRIG") field in the configuration register 104a allows the specification of the output of another counter/timer unit 100a, 100b to be used as a trigger. There are several areas where the trigger function may be used to create extremely sophisticated pattern outputs. If the TRIG field is 0, the triggering function is disabled. Otherwise, TRIG specifies the internal output of another counter/timer unit 100a, 100b to be used as the trigger. The TRIG field may also specify an action taken in response to a signal on the selected internal output. Examples of actions that may be specified by the TRIG field are outlined below.

Initiating a One-Shot Operation

Figure 5K:
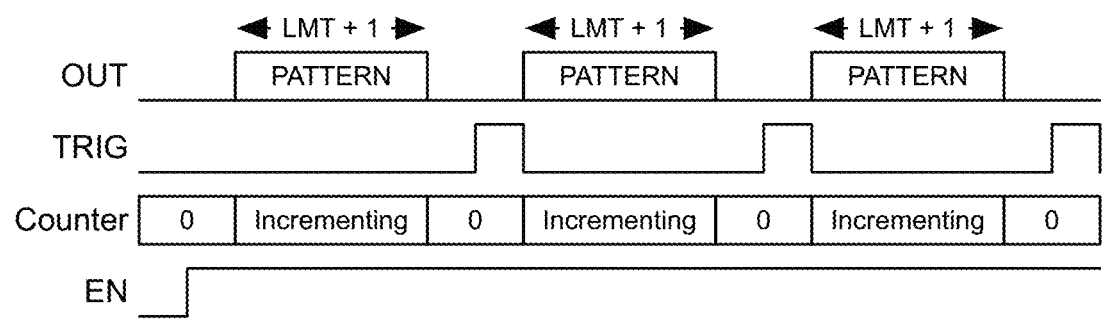

If the mode of a counter/timer unit 100a, 100b is a one-shot mode (FN=2 or 4), when EN is asserted, one cycle of the operation will be executed. At that point, a rising edge on the trigger signal selected by TRIG will cause the operation to be executed again. This allows the creation of complex operations with a single configuration. FIG. 5K shows an example of this. The TRIG signal in FIG. 5K is the OUT signal from a counter/timer module configured for Repeat Count (FN=1).

Terminating a Repeat Operation

Figure 5L:
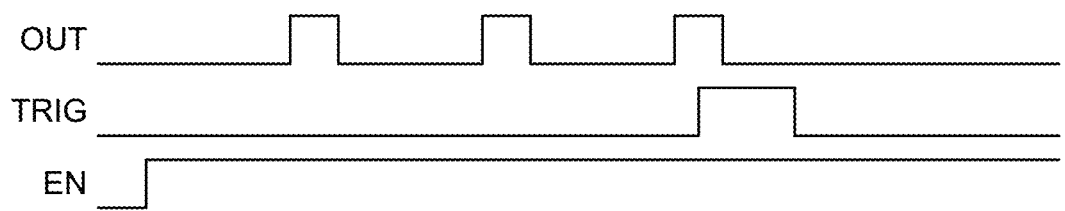

If the mode of a counter/timer unit 100a, 100b is a repeat mode (FN=1, 3 or 5), the rising edge of the TRIG signal will cause the repeated operation to terminate after the current cycle is complete. This allows the easy creation of a burst of pulses or patterns of a specified length. This is shown in FIG. 5L for the case of Repeat Pulse mode. In this case the TRIG signal is the output of a counter/timer unit 100a, 100b configured in Single Pulse mode (FN=2) with the time configured to be somewhat more than 3 times the pulse repeat. When the TRIG signal occurs, the pulse output is terminated at the end of the current cycle.

Complex Patterns with Triggers

The two trigger modes can be combined to produce even more complex patterns. As a particular example, the OUT signal of FIG. 5L could be selected as the TRIG signal in FIG. 5K. This would then produce exactly four bursts of the pattern.

Dual Edge Triggers

Some of the trigger input selections in the configuration register 104a, 104b may specify dual edge triggers. In that case, the trigger occurs on both the rising and falling edge of the internal output specified as the trigger signal. This is very valuable in some stepper motor applications described below.

Trigger Controlled Inversion

If a REG_CTIMER_CTAUXxy_TMRxyTINV bit is set in the configuration register 104a, 104b both the OUT and OUT2 outputs will be XORed with the trigger signal selected by TRIG. This enables some complex stepper motor configurations described below.

Clocking Timer/Counters with Other Counter/Timer Outputs

There are cases where it is very valuable to use the output of a counter/timer unit 100a, 100b as the clock of another counter/timer unit 100a, 100b. A TMRxyCLK field includes in the configuration register 104a, 104b is used to select an output of a counter/timer unit 100a, 100b or from one or more other clocks taken from the internal oscillators. An example of such a function is the terminated count shown in FIG. 5L. If the clock of the counter/timer unit 100a, 100b which produces the TRIG signal were taken from the OUT output of a first counter/timer unit 100a, 100b, the CMPRA0 or CMPRB0 value used for the trigger generator would be trivially calculated as 2, and would be independent of the actual clock used to generate the OUT signal.

Global Timer/Counter Enable

There are times when it is very important to be able to start multiple counter/timer modules 100 together, particularly in cases where one output is used as the trigger of another. A REG_CTIMER_GLOBEN ("GLOBEN") register contains one enable bit for each counter/timer module, which is ANDed with the local EN bit of that counter/timer module 100. The GLOBEN register normally has all bits set to 1, so that the local EN bits control the timers. For synchronized enabling, the GLOBEN register bits may be to 0, and then the local EN bits of those timers are set to 1. A single write to multiple bits of the GLOBEN register will therefore simultaneously enable all of the timers corresponding to the multiple bits.

Example Use Cases for Linked Counter/Timer Units

Software Generated Serial Data Stream

It is possible to use the Repeat Pattern mode to produce a serial data stream, such as PDM (pulse density modulation). A counter/timer unit 100a, 100b would be configured to use an external pad as the selected clock. Software would load the CMPRA0/1/2/3 registers with a first segment of the pattern (64 bits in this example). When the secondary interrupt is received, the first half of the first segment (32 bits in this example) will have been transferred, and software can load the first half of a second segment of the pattern into CMPRA0/1. When the next secondary interrupt is generated, software can load the next half of the second segment into the CMPRA2/3 registers, and continue to toggle between the two pairs of registers in this manner for subsequent segments of the pattern. This can continue indefinitely.

Note that the requirement for software to update the registers continuously will require the processor to remain awake, unless the transfer is quite slow. For example, if the clock frequency were 1 MHz, software would have to load a 32-bit register every 32 μs, which would probably not support a wakeup interrupt. However, at lower frequencies this could be a useful function.

Software Generated PWM Audio Output

The Alternate Pulse mode can be used to efficiently create an audio output stream in software. In many cases, audio can be effectively produced by generating a stream of pulses with a fixed period, but a variable duty cycle (i.e. a variable pulse width or pulse width modulation (PWM)). When this is applied through a low pass filter, reasonable audio output will result. In Alternate Pulse mode, CMPRA1 and CMPRA3 are set to the desired sample period, and CMPRA0 and CMPRA2 are configured with the widths of the first two pulses. When the interrupt occurs at the end of the period, software loads CMPRA0 with the next pulse width. When the next interrupt occurs, software loads CMPRA2 with the next pulse width, and toggles between the two registers for each subsequent pulse. Because the sample rate of audio is often quite slow, software can generally handle this process in an interrupt driven fashion. When the interrupt occurs, there is a full sample period before new register data is needed, so that the interrupt service requirement is easy to achieve.

Stepper Motor Examples

Several features of the counter/timer module 100 are specifically optimized for creating the control signals for stepper motors. This section includes some examples of configurations which allow very complex operations with minimal processor interrupts.

I. Unidirectional Stepper Motor

Figure 6A:
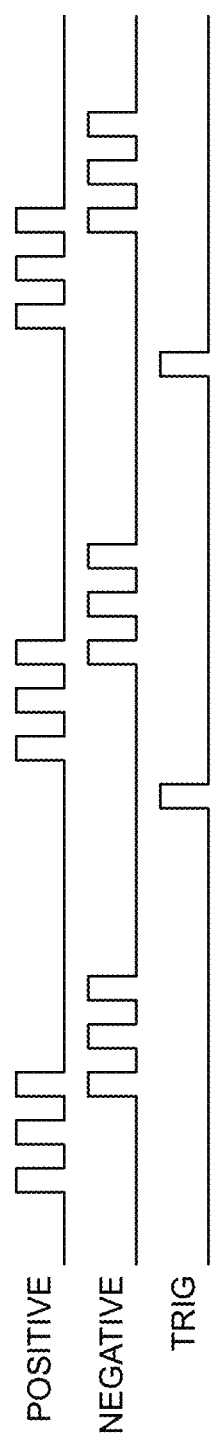
FIGS. 6A through 6E are timing diagrams illustrating uses for an array of counter/timer modules in accordance with an embodiment of the present invention.

A common requirement for stepper motors is that there are POSITIVE and NEGATIVE signals required, which must occur in a precise sequence. An example is shown in FIG. 6A, where the NEGATIVE signal must be delayed from the POSITIVE signal, and both are complex patterns in order to optimize power consumption. Assuming the POSITIVE and NEGATIVE patterns will fit into two compare registers CMPRA0/1/2/3 (32 bits in this example), these two signals can be generated as the OUT and OUT2 outputs from a single counter/timer unit 100a, 100b. For example, the counter/timer unit 100a, 100b may be configured in Single Pattern mode (FN=4), and the TRIG field selects the waveform labeled as TRIG in FIG. 6A. The TRIG signal comes from another counter/timer unit 100a, 100b which is configured to generate a fixed number of pulses. Thus if a specific number of pulse bursts is required to move the stepper by the desired amount, the entire operation can be configured as a single operation and will require no interrupt servicing.

The same pattern would support a continuously running stepper motor, such as the second hand of a watch. The TRIG signal above would be free running and not terminated in that case.

II. Multiple Bidirectional Stepper Motors

Figure 6B:
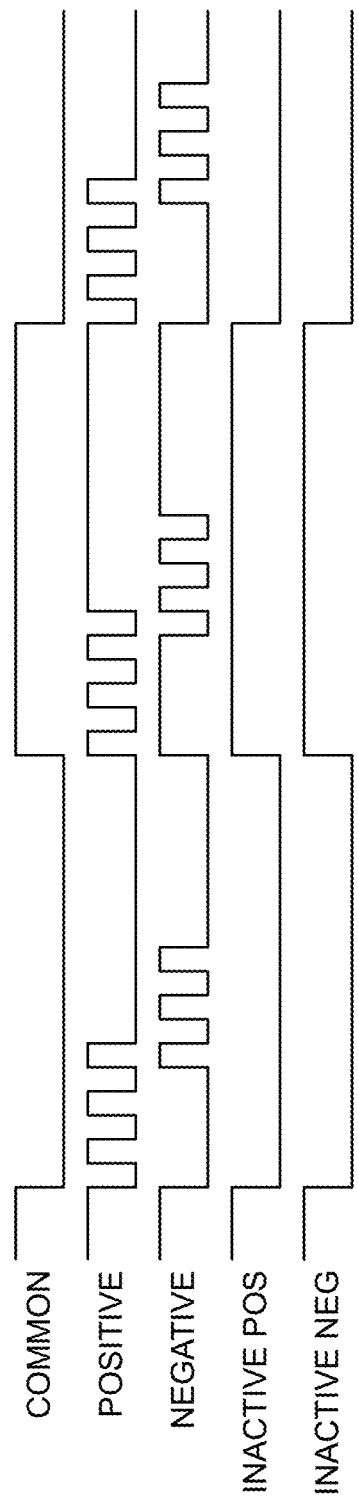

A more complex case involves the control of a bidirectional stepper motor. This type of motor often has a COMMON signal, and the polarity between the COMMON and POSITIVE/NEGATIVE signals must be managed. Many systems include multiple motors that share a single COMMON signal, and the POSITIVE and NEGATIVE signals of those motors must match the COMMON line to avoid unwanted steps. A typical case is shown in FIG. 6B, where the INACTIVE POS/NEG signals are the POSITIVE and NEGATIVE connections to currently inactive motors.

The COMMON signal is generated from the OUT2 output of a first counter/timer unit 100a, 100b in PWM mode configured in divide-by-two mode for a specified number of transitions. This is necessary because COMMON should remain at the ending value if there are an odd number of pulse bursts. As in the unidirectional case, POSITIVE and NEGATIVE are generated from the OUT and OUT2 outputs of a single second counter/timer unit 100a, 100b in Single Pattern mode. The second counter/timer unit 100a, 100b is configured with the COMMON signal as its trigger, in Dual Edge Trigger mode so that a pattern is generated on each edge of COMMON. The TINV signal is also set in the second counter/timer unit 100a, 100b, so that the output patterns are inverted as a function of COMMON.

The INACTIVE POS and INACTIVE NEG signal pairs come from the OUT and OUT2 outputs of a third counter/timer unit 100a, 100b for each inactive stepper. Those timers are not enabled but have their TINV bit set and TRIG set to select the COMMON signal, so that their outputs are inverted as a function of the trigger and therefore follow COMMON.

This configuration allows the complete operation of any number of pulse bursts to be sent to a bidirectional stepper with a single configuration, requiring no processor interrupts.

Pattern-Based Sine Wave Examples

Figure 6C:
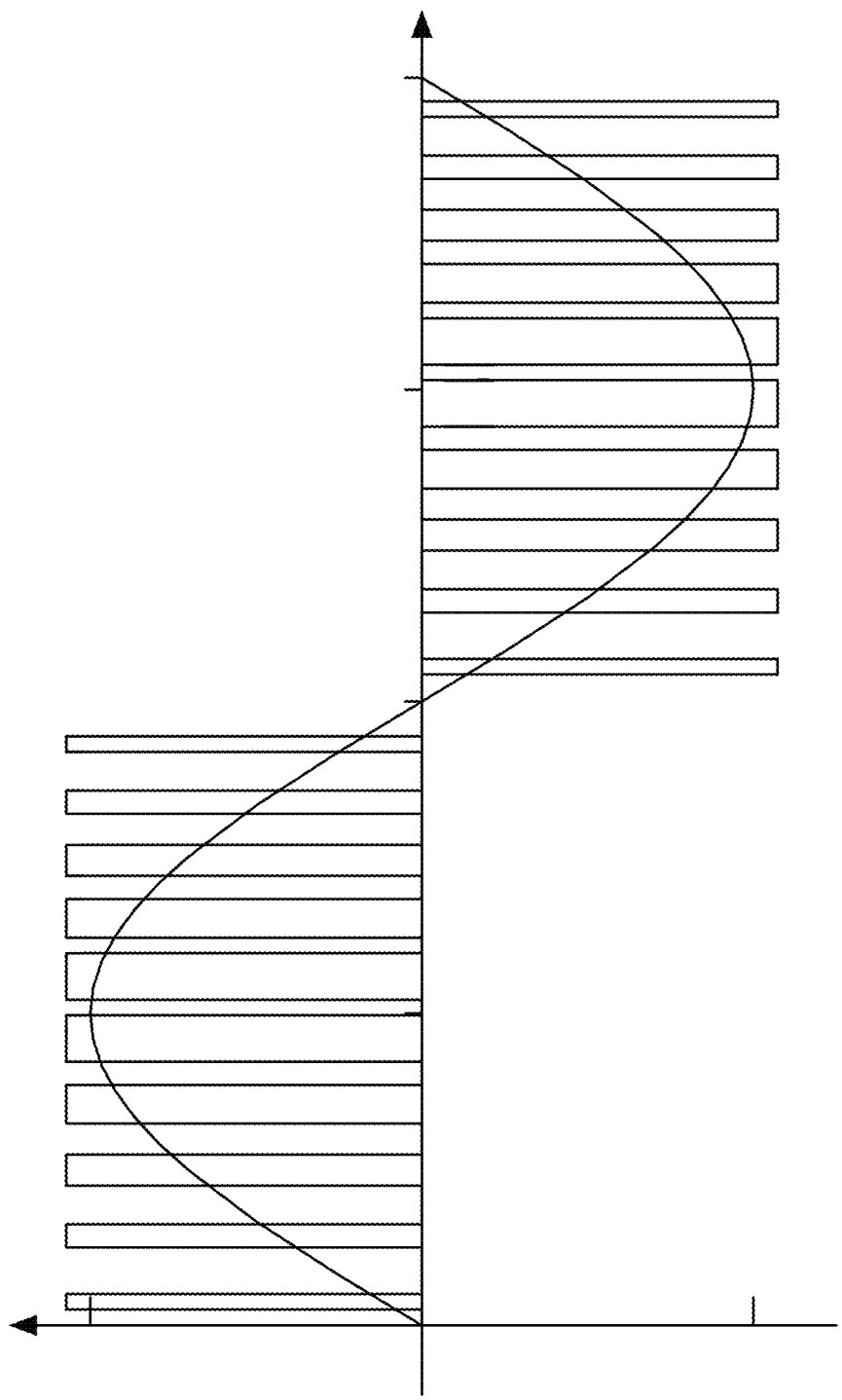

Some applications, such as driving the Linear Resonance Actuator (LRA) in a Haptic Driver or vibrator, require the generation of a pattern which is integrated into an analog signal, most commonly as a sine wave. FIG. 6C shows the typical function. The square pulses have variable duty cycles, and they are integrated by the external device to produce the sine wave. The external device typically has positive and negative inputs, so the positive-going pulses occur on a pin which is connected to the positive input and the negative-going pulses are actually positive pulses connected to the negative input. A counter/timer unit 100a, 100b can generate these pulse trains in two different ways.

Figure 6D:
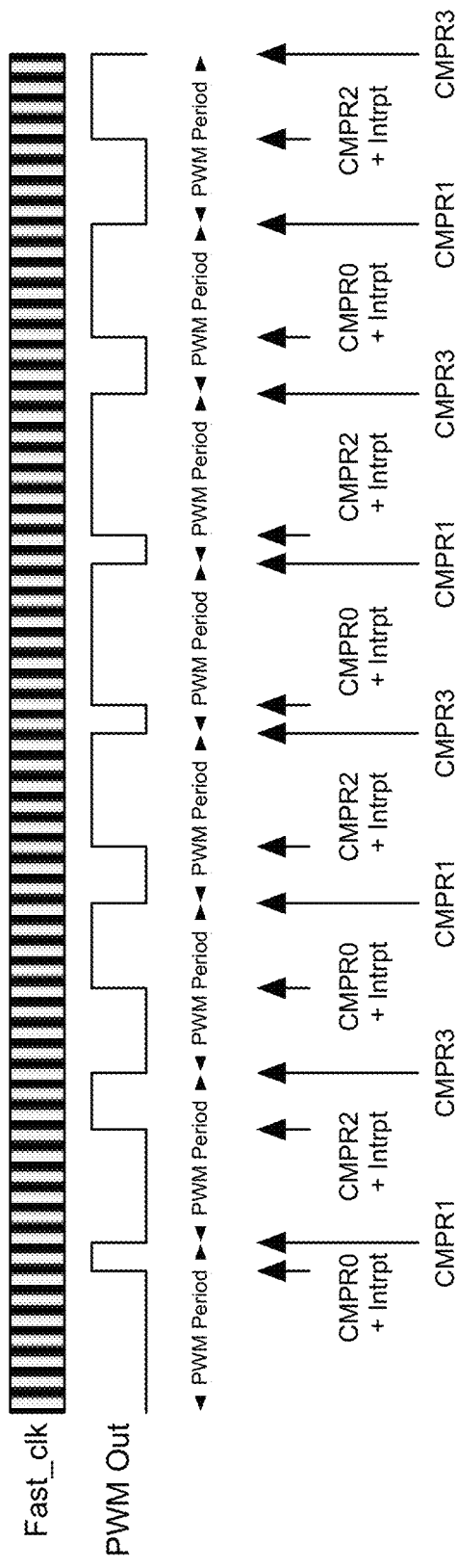

In a first approach, the pulse patterns shown in FIG. 6C can be generated using the Alternate Pulse (FN=7, described above with respect to FIG. 5H) function. The PWM pulses are shown in FIG. 6D. Initially the CMPRA0/1/2/3 registers are configured with the desired parameters for the first two pulses. In many cases, the PWM Period is fixed so that CMPRA1/3 contain the same value and never change, but these times can also be varied.

When the first interrupt is received at the end of first CMPRA0 period, software will update the CMPRA0 register with the value required in the next period (and would also update CMPRA3 with the next value if it should change). When the next interrupt is received at the comparison to CMPRA2, a new CMPRA2 value (and a new CMPRA1 value if desired) are loaded. This process proceeds throughout the cycle which generates ½ of the sine wave. A similar process is repeated for the negative output to produce the second ½ of the sine wave. Note that software may preferably be able to respond to the interrupt within a period which is slightly longer than the PWM Period, in order to insure that the correct comparison values are loaded.

Figure 6E:
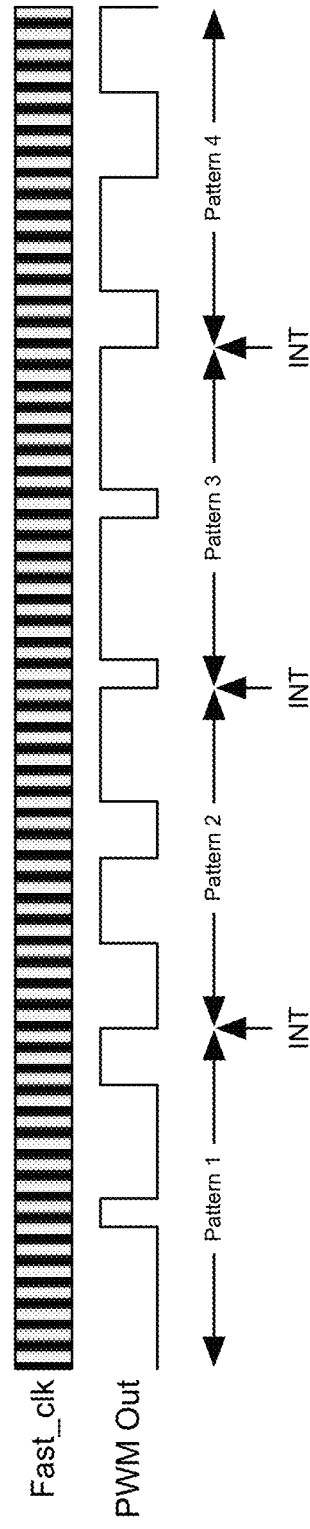

In a second approach, the Repeated Pattern function (FN=5, FIG. 5F) is used. This is shown in FIG. 6E and assumes the same pattern as the one in FIG. 6E. However, in this case the first N bits of the desired pattern (where N can be 64 or 128 in the illustrated embodiments) are loaded into the CMPRA0/1/2/3 registers of either a single counter/timer unit 100a, 100b (for 64-bit patterns in the illustrated example) or both of the counter/timer units 100a, 100b of a counter/timer module 100 that have been linked (for 128-bit patterns in the illustrated example). A full pattern consists of both Pattern 1 and Pattern 2 in FIG. 6E, for example. The process is started, and an interrupt will occur after ½ of the first full pattern (32 or 64 bits in the illustrated example) has been generated. At that point software loads a new ½ pattern into the appropriate CMPR registers, and the process continues until the complete pattern has been generated.

The selection of 64-bit vs. 128-bit patterns is a tradeoff between power (the longer pattern results in half as many interrupts) and resource usage (the longer pattern requires two counter/timer units 100a, 100b instead of one). If there are sufficient counter/timer units 100a, 100b available, the 128-bit pattern is always more efficient. For smaller or larger sizes for CMPRA0/1/2/3 and CMPRB0/1/2/3

Both the PWM and Repeated Pattern approaches to sine wave generate produce the same result in terms of the generated pattern, so the selection may be made as a function of reducing the number of interrupts required to produce the overall pattern. Fewer interrupts result in longer CPU sleep times and less interrupt servicing overhead, which reduces the overall power. If the half pattern can cover more time than the average PWM Period, the Pattern-based approach will typically be more energy efficient. Whether this is the case is a function of the desired fast clock frequency (Fast_clk), which determines the precision of the pulses, and the desired pulse lengths.

Counting External Pulses

A counter/timer unit 100a, 100b may be configured to operate in a counter mode (see functions for FN=0, 1, 2, 3, 6, and 7, described above with respect to FIGS. 6A-6D, 6G, and 6H) while a TMRxyCLK ("CLK") field of the configuration register 104a, 104b selects either an external pad input (if 0x00) or a buck pulse input (if 0x10). Although any of the counter modes may be selected, the typical configuration is Continuous (FN=6, FIG. 5G). In this mode the counter/timer unit 100a, 100b will count edges on the selected clock, and may be configured to generate an interrupt on a particular count value. The different clock selections provide different functions.

If the CLK field is 0x00, the clock input for the counter/timer unit 100a, 100b comes from an external pad as selected by an INCFG register of the counter/timer unit 100a, 100b. This allows the counter/timer unit 100a, 100b to monitor pulses or edges on an external signal.

In some embodiments, the controller 102 may include two separate analog buck converters which provide power for a processor 300 power domain (BUCKA) and a memory power domain (BUCKB). Each counter/timer unit 100a, 100b may be connected to a pulse stream from one of the two analog buck converters. One pulse is generated each time the buck converter inserts charge into a capacitor. Therefore, the number of pulses is a good indication of the amount of energy used by the corresponding power domain in a particular time period.

A possible option to determine energy consumption is as follows. Two counter/timer units 100a, 100b could be configured with FN=4 so that they count continuously. A first is supplied a buck converter pulse stream as its clock, and a second is supplied with a divided version of an internal low power oscillator to avoid creating extra power consumption due to the power measurement. Once configured, the two counters may then be enabled simultaneously, and, after some period of system operation, they should be disabled and the counters 106a, 106b of the two counter/timer units 100a, 100b may then be read. The LFRC count value of the second counter/timer unit 100a, 100b would now define how much real time has elapsed, and the buck converter count value of the first counter/timer unit 100a, 100b would define how much energy was consumed in that time.

In one example, a counter/timer unit 100a may select BUCKA pulses as the clock source and a counter/timer unit 100b can select BUCKB pulses as the clock source.

Linking Counter/Timer Units to One Another and to Output Pads

In one example embodiment, the array of counter/timer modules 100 has 32 pads, which can be configured for either inputs to or outputs from a particular counter/timer unit 100a, 100b. Each of these pads can be driven by one of four outputs selected by values in REG_CTIMER_OUTCFG1/2 ("CFG") registers incorporated into the counter/timer modules 100. This is shown in Table 1, below. The ctimer_out column specifies the bit in a REG_CTIMER_ENCFG register which enables that pad output. The Output Selection columns define the output choices for each output, where CFG=0 forces the output to 0, CFG=1 forces the output to 1 and CFG=2 through 7 produce the choices in the table.

TABLE 1

Pad Selection Function

| PAD (FNCSEL) | ctimer_out | Output Selection | | | | | |
|---|---|---|---|---|---|---|---|
| | | Direct CFG = 2 | Legacy CFG = 3 | Alt1 CFG = 4 | Alt2 CFG = 5 | COM6 CFG = 6 | COM7 CFG = 7 |
| 12 (2) | CT0 | A0OUT | B2OUT2 | A5OUT2 | A6OUT | A6OUT2 | A7OUT2 |
| 13 (2) | CT2 | B0OUT | B1OUT2 | B6OUT2 | A7OUT | A6OUT2 | A7OUT2 |
| 18 (2) | CT4 | A1OUT | A2OUT2 | A5OUT2 | B5OUT | A6OUT2 | A7OUT2 |
| 19 (2) | CT6 | B1OUT | A1OUT | B5OUT2 | B7OUT | A6OUT2 | A7OUT2 |
| 20 (2) | CT8 | A2OUT | A3OUT2 | A4OUT2 | B6OUT | A6OUT2 | A7OUT2 |
| 21 (2) | CT10 | B2OUT | B3OUT2 | B4OUT2 | A6OUT | A6OUT2 | A7OUT2 |
| 22 (2) | CT12 | A3OUT | B1OUT | B0OUT2 | B6OUT2 | A6OUT2 | A7OUT2 |
| 23 (2) | CT14 | B3OUT | B1OUT | B7OUT2 | A7OUT | A6OUT2 | A7OUT2 |
| 25 (2) | CT1 | A0OUT2 | A0OUT | A5OUT | B7OUT2 | A6OUT2 | A7OUT2 |
| 26 (2) | CT3 | B0OUT2 | B0OUT | A1OUT | A6OUT | A6OUT2 | A7OUT2 |
| 27 (2) | CT5 | A1OUT2 | A1OUT | B6OUT | A7OUT | A6OUT2 | A7OUT2 |
| 28 (2) | CT7 | B1OUT2 | B1OUT | B5OUT | A7OUT | A6OUT2 | A7OUT2 |
| 29 (2) | CT9 | A2OUT2 | A2OUT | A4OUT | B0OUT | A6OUT2 | A7OUT2 |
| 30 (2) | CT11 | B2OUT2 | B2OUT | B4OUT | B5OUT2 | A6OUT2 | A7OUT2 |
| 31 (2) | CT13 | A3OUT2 | A3OUT | A6OUT | B4OUT2 | A6OUT2 | A7OUT2 |
| 32 (2) | CT15 | B3OUT2 | B3OUT | A7OUT | A4OUT2 | A6OUT2 | A7OUT2 |
| 42 (2) | CT16 | A4OUT | A0OUT | A0OUT2 | B3OUT2 | A6OUT2 | A7OUT2 |
| 43 (2) | CT18 | B4OUT | B0OUT | A0OUT | A3OUT2 | A6OUT2 | A7OUT2 |
| 44 (2) | CT20 | A5OUT | A1OUT | A1OUT2 | B2OUT2 | A6OUT2 | A7OUT2 |
| 45 (2) | CT22 | B5OUT | A6OUT | A1OUT | A2OUT2 | A6OUT2 | A7OUT2 |
| 46 (2) | CT24 | A6OUT | A2OUT | A1OUT | B1OUT2 | A6OUT2 | A7OUT2 |
| 47 (2) | CT26 | B6OUT | B2OUT | A5OUT | A1OUT2 | A6OUT2 | A7OUT2 |
| 48 (2) | CT28 | A7OUT | A3OUT | A5OUT2 | B0OUT2 | A6OUT2 | A7OUT2 |
| 49 (2) | CT30 | B7OUT | B3OUT | A4OUT2 | A0OUT2 | A6OUT2 | A7OUT2 |
| 4 (6) | CT17 | A4OUT2 | B7OUT | A4OUT | A1OUT2 | A6OUT2 | A7OUT2 |
| 41 (1) | CT19 | B4OUT2 | A2OUT | B4OUT | B1OUT2 | A6OUT2 | A7OUT2 |
| 24 (5) | CT21 | A5OUT2 | A1OUT | B5OUT | A0OUT2 | A6OUT2 | A7OUT2 |
| 33 (6) | CT23 | B5OUT2 | A7OUT | A5OUT | B0OUT2 | A6OUT2 | A7OUT2 |
| 39 (2) | CT25 | B4OUT2 | B2OUT | A6OUT | A2OUT2 | A6OUT2 | A7OUT2 |
| 35 (5) | CT27 | B6OUT2 | A1OUT | B6OUT | B2OUT2 | A6OUT2 | A7OUT2 |
| 37 (7) | CT29 | B5OUT2 | A1OUT | A7OUT | A3OUT2 | A6OUT2 | A7OUT2 |
| 11 (2) | CT31 | B7OUT2 | A6OUT | B7OUT | B3OUT2 | A6OUT2 | A7OUT2 |

Each counter/timer unit 100a, 100b may be clocked by one of two of the pads, selected by a REG_CTIMER_INCFG register. The REG_CTIMER_ENCFG register holds one bit for each pad, which selects whether the pad is an output (if 0) or an input (if 1).

The assignments in Table 1 assume that COMMON outputs will be created from either A7OUT2 or A6OUT2. These outputs can also be used in the case where it is desired to drive multiple outputs from the same timer.

Note that for the Pulse and Count modes, the CMPRA2/3 registers can always be configured so that OUT2 matches OUT. This provides more flexibility in the pin assignments, as any OUT2 connection can be used as the corresponding OUT function if a separate OUT2 function is not required. For a single 32-bit pattern from a timer, OUT2 can be configured in the CMPRA2/3 registers to produce the same pattern as OUT.

The OUT and OUT2 outputs of each counter/timer 100a, 100b will be asserted according to the selected mode whenever the counter/timer unit 100a, 100b is enabled, independent of any pin connections configured for it. This allows these signals to be used as clocks and triggers for other counter/timer units 100a, 100b even when they are not being used as pin outputs.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

In general, in this disclosure the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive Boolean states may be referred to as logic_0 and logic_1. Consistent system operation can be obtained by reversing the logic sense of all such signals, such that signals described herein as logically true become logically false and vice versa. Furthermore, it is of no relevance in such systems which specific voltage levels are selected to represent each of the logic states.

Reference to a facility or a system can mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities.

Embodiments in accordance with the present disclosure may be embodied in whole or in part as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

The invention claimed is:

1. An apparatus for use with a processing device executing software and with a peripheral device, the apparatus comprising:

a plurality of counter/timer modules configured to receive a plurality of parameters and execute an instruction from the processing device according to the plurality of parameters, each counter/timer module of the plurality of counter/timer modules having a clock input line, one or more registers, one or more output lines, and an enable line, the each counter/timer module being programmed to store one or more values in the one or more registers according to the plurality of parameters, perform a counting function upon assertion of the enable line according to signals on the clock input line and the one or more registers, and to produce output signals on the one or more output lines according to the counting function, the counting function being according to the plurality of parameters;

wherein the plurality of counter/timer modules are further configured to, subsequent to receiving the instruction, generate a pattern of multiple transitions according to the plurality of parameters on the one or more output lines of at least a portion of the plurality of counter/timer modules, without additional control inputs from the processing device subsequent to the instruction, the pattern of multiple transitions effective to control the peripheral device; and wherein the apparatus further comprises an interconnection matrix programmed to, for any pair of counter/timer modules of the plurality of counter/timer modules as a first counter/timer module and a second counter/timer module:

in response to the plurality of parameters including a first code, couple the clock input line of the first counter/timer module to one of the one or more output lines of the second counter/timer module; and in response to the plurality of parameters including a second code, couple the enable line of the first counter/timer module to one of the one or more output lines of the second counter/timer module of the plurality of counter/timer modules.

2. The apparatus of claim 1, wherein the plurality of counter/timer modules are further configured to generate the pattern of multiple transitions according to the plurality of parameters such that the pattern includes pulses at least one of (c) occurring at non-uniform intervals and (d) having non-uniform widths.

3. The apparatus of claim 1, wherein each counter/timer module of the plurality of counter/timer modules is further configured to, when indicated by the plurality of parameters, output a pattern of transitions corresponding to bits of stored in a register of the one or more registers of the each counter/timer module.

4. The apparatus of claim 1, wherein each counter/timer module of the plurality of counter/timer modules is further configured to, when indicated by the plurality of parameters, invert an output of the each counter/timer module of the plurality of counter/timer modules according to an output of another counter/timer module of the plurality of counter/timer modules.

5. The apparatus of claim 1, wherein the plurality of counter/timer modules are further configured to generate the pattern of multiple transitions according to the plurality of parameters by generating a pattern of pulses in a plurality of repeating cycles on a first output of the one or more outputs and cause a second output of the one or more outputs to change value only once for each cycle of the plurality of repeating cycles.

6. The apparatus of claim 5, wherein the plurality of counter/timer modules are further configured to generate the pattern of multiple transitions according to the plurality of parameters such that the first output is inverted in response to the second output changing value.

7. The apparatus of claim 1, wherein each counter/timer module of the plurality of counter/timer modules further include at least one counter;
wherein each counter/timer module is configured to, when indicated by the plurality of parameters:
store one or more compare values in the one or more registers;
update the counter according to signals received on the clock input line subsequent to receiving the instruction; and
change a state of at least one of a first output and a second output of the one or more output lines of the each counter/timer module according to at least one state of the at least one counter and the one or more compare values; and
wherein the plurality of counter/timer modules are further configured to generate the pattern of multiple transitions according to the plurality of parameters effective to output a pattern to the peripheral device subsequent to receiving the instruction without any other control inputs from the processing device invoked by the software.

8. The apparatus of claim 1, wherein the plurality of counter/timer modules are further configured to begin generating the pattern of multiple transitions on the output lines according to the plurality of parameters upon receiving a global synchronization signal from the processing device.

9. A system comprising:
a counter/timer module comprising—
a clock input;
a counter;
a compare register; and
control logic configured to receive one or more parameters and (a) when the one or more parameters include a first code, increment the counter in response to each cycle on the clock input and generate a signal on an output when the counter is equal to contents of the compare register and (b) when the one or more parameters include a second code, increment the counter for each clock cycle on the clock input and, for each clock cycle, output on the output a signal corresponding to a bit stored in the compare register at a bit position corresponding to a current value of the counter.

10. The system of claim 9, wherein the control logic is further configured to:
when indicated by the one or more parameters, perform (a) at least one of a single time and repeatedly; and
when indicated by the one or more parameters, perform (b) at least one of a single time and repeatedly.

11. The system of claim 9, wherein the counter/timer module is one of a plurality of identical counter/timer modules, wherein the control logic of each counter/timer module is further configured to:
when indicated by the one or more parameters, control its operation according to an output of another counter/timer of the plurality of counter/timer modules.

12. The system of claim 11, wherein all of the counter/timer modules of the plurality of counter/timer modules are coupled to a global synchronization input and the control logic of each counter/timer module is programmed to execute according to the one or more parameters only upon receiving a signal on the global synchronization input.

13. The system of claim 11, further comprising:
an interconnection matrix coupling each controller of each counter/timer module of the plurality of counter/timer modules to the outputs of at least a portion of other counter/timer modules of the plurality of counter/timer modules;
wherein the control logic of each counter/timer module of the plurality of counter/timer modules is further configured to take as an input one of the outputs of another counter/timer module of the plurality of counter/timer modules when indicated by the one or more parameters.

14. The system of claim 13, wherein the control logic of each counter/timer module of the plurality of counter/timer modules is further configured to:
when indicated by the one or more parameters, use the output of another counter/timer of the plurality of counter/timer modules as the clock input.

15. The system of claim 13, wherein the control logic of each counter/timer module of the plurality of counter/timer modules is further configured to:
when indicated by the one or more parameters, start performing one of (a) and (b) in response the output of another counter/timer of the plurality of counter/timer modules.

16. The system of claim 13, wherein the control logic of each counter/timer module of the plurality of counter/timer modules is further configured to:
when indicated by the one or more parameters, stop performing one of (a) and (b) in response to the output of another counter/timer of the plurality of counter/timer modules.

17. The system of claim 13, wherein the control logic of each counter/timer module of the plurality of counter/timer modules is further configured to:
when indicated by the one or more parameters, change polarity of the output of the each counter/timer module in response to the output of another counter/timer of the plurality of counter/timer modules.

18. The system of claim 13, wherein the control logic of each counter/timer module of the plurality of counter/timer modules is further configured to:
when indicated by the one or more parameters, repeat one of (a) and (b) according to the output of another counter/timer of the plurality of counter/timer modules.

* * * * *